United States Patent
Maejima

(10) Patent No.: US 9,672,929 B2
(45) Date of Patent: Jun. 6, 2017

(54) SEMICONDUCTOR MEMORY IN WHICH SOURCE LINE VOLTAGE IS APPLIED DURING A READ OPERATION

(71) Applicant: KABUSHIKI KAISHA TOSHIBA, Tokyo (JP)

(72) Inventor: Hiroshi Maejima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/174,114

(22) Filed: Jun. 6, 2016

(65) Prior Publication Data

US 2017/0069394 A1 Mar. 9, 2017

(30) Foreign Application Priority Data

Sep. 8, 2015 (JP) ................................. 2015-176422

(51) Int. Cl.
  *G11C 16/04* (2006.01)
  *G11C 16/26* (2006.01)
  *G11C 16/34* (2006.01)
  *G11C 16/10* (2006.01)

(52) U.S. Cl.
  CPC .......... *G11C 16/26* (2013.01); *G11C 16/0483* (2013.01); *G11C 16/10* (2013.01); *G11C 16/3459* (2013.01)

(58) Field of Classification Search
  CPC ...... G11C 16/26; G11C 16/10; G11C 16/3459; G11C 16/0483
  USPC ..................................................... 365/185.17
  See application file for complete search history.

(56) References Cited

U.S. PATENT DOCUMENTS

| 6,134,157 | A | * | 10/2000 | Takeuchi | ............... G11C 16/10 365/200 |
| 7,391,646 | B2 | * | 6/2008 | Cernea | ................... G11C 16/08 365/185.03 |
| 7,660,157 | B2 | | 2/2010 | Maejima et al. | |
| 7,663,932 | B2 | | 2/2010 | Hamada et al. | |
| 7,920,421 | B2 | * | 4/2011 | Maejima | ............. G11C 11/5642 365/185.03 |
| 2014/0286093 | A1 | | 9/2014 | Abe et al. | |

* cited by examiner

*Primary Examiner* — Tha-O H Bui
(74) *Attorney, Agent, or Firm* — Patterson & Sheridan, LLP

(57) ABSTRACT

A semiconductor memory device includes a memory cell, a word line electrically connected to a gate of the memory cell, and a source line electrically connected to a first end of the memory cell. During a read operation of the memory cell, a first voltage is applied to the source line in a first operation to determine whether or not a threshold voltage of the memory cell is above a first threshold value, a second voltage is applied to the source line in a second operation to determine whether or not the threshold voltage of the memory cell is above a second threshold value, and a third voltage is applied to the source line in a third operation to determine whether or not the threshold voltage of the memory cell is above a third threshold value.

18 Claims, 17 Drawing Sheets

| Case | 1 | 2 | 3 | 4 | 5 |
|---|---|---|---|---|---|
| CMD A | WL step with ABL | WL step with ABL | WL step with BLshield | WL step with BLshield | CELSRC step with ABL |
| CMD B | CELSRC step with ABL | CELSRC step with BLshield | CELSRC step with ABL | CELSRC step with BLshield | CELSRC step with BLshield |

SEMICONDUCTOR MEMORY IN WHICH SOURCE LINE VOLTAGE IS APPLIED DURING A READ OPERATION

CROSS-REFERENCE TO RELATED APPLICATION

This application is based upon and claims the benefit of priority from Japanese Patent Application No. 2015-176422; filed Sep. 8, 2015, the entire contents of which are incorporated herein by reference.

FIELD

Embodiments described herein relate generally to a semiconductor memory device.

BACKGROUND

Generally, a NAND flash memory is known as one type of a semiconductor memory device.

DETAILED DESCRIPTION

Embodiments provide a semiconductor memory device, the operation speed of which is improved.

In general, according to one embodiment, there is provided a semiconductor memory device including a memory cell, a word line electrically connected to a gate of the memory cell, and a source line electrically connected to a first end of the memory cell. During a read operation of the memory cell, a first voltage is applied to the source line in a first operation to determine whether or not a threshold voltage of the memory cell is above a first threshold value, a second voltage is applied to the source line in a second operation to determine whether or not the threshold voltage of the memory cell is above a second threshold value, and a third voltage is applied to the source line in a third operation to determine whether or not the threshold voltage of the memory cell is above a third threshold value.

Hereinafter, embodiments will be described with reference to the accompanying drawings. In the following description, the same reference signs will be given to elements having the same functions and the same configurations.

[1] First Embodiment

A semiconductor memory device 1 according to a first embodiment includes multiple memory cells. Each of the memory cells is capable of storing multiple-valued data. In a read operation for a page (will be described in detail later), the semiconductor memory device of the embodiment changes the voltage of a source line while holding the voltage of a word line at a certain voltage without decreasing the voltage of the word line.

[1-1] Configuration

[1-1-1] Entire Configuration

Figure 1:
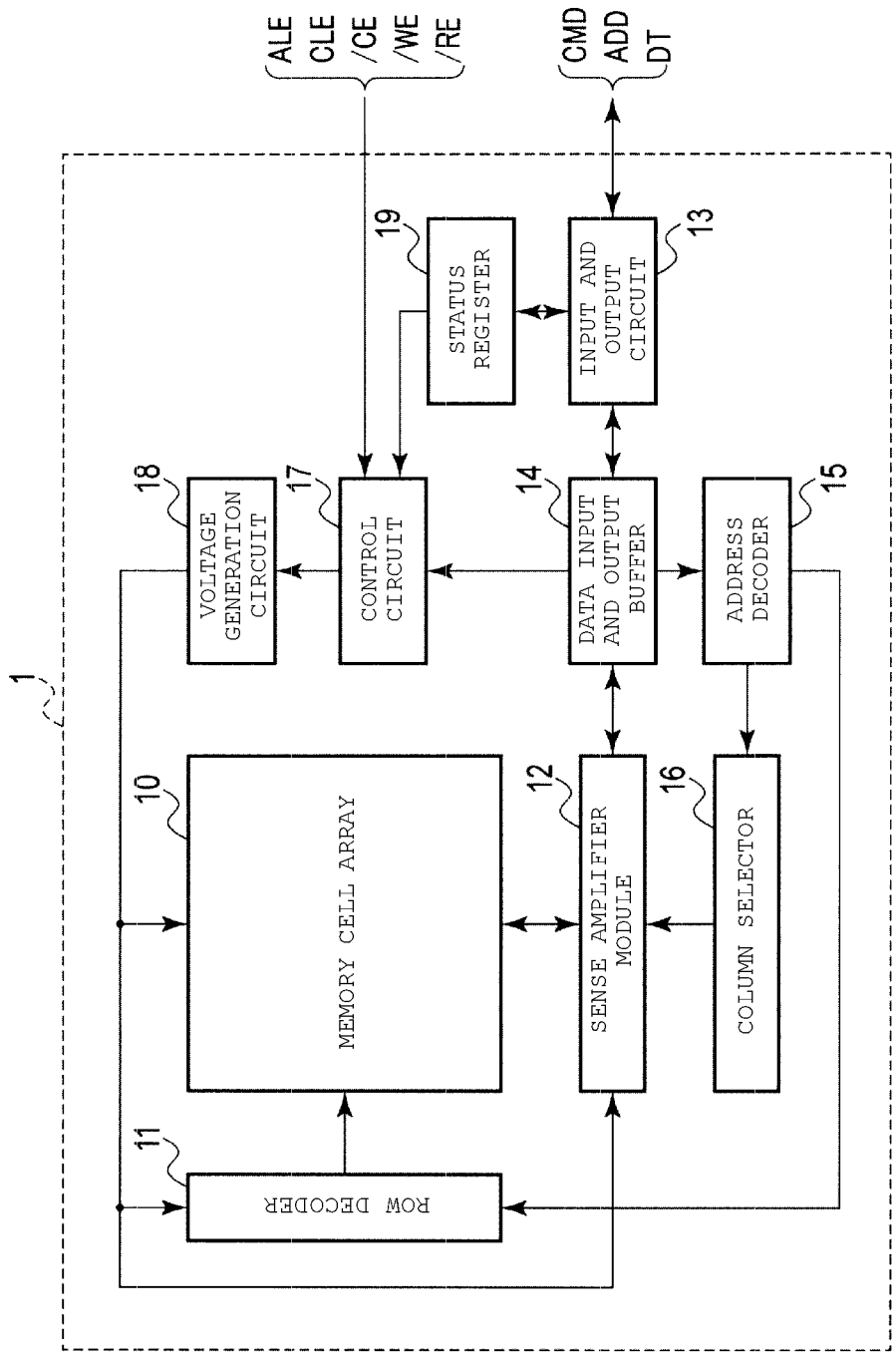
FIG. 1 is a block diagram of a semiconductor memory device according to a first embodiment.

The entire configuration of the semiconductor memory device 1 will be described with reference to FIG. 1. The semiconductor memory device 1 includes a memory cell array 10; a row decoder 11; a sense amplifier module 12; an input and output circuit 13; a data input and output buffer 14; an address decoder 15; a column selector 16; a control circuit (sequencer) 17; a voltage generation circuit 18; and a status register 19.

The memory cell array 10 includes multiple memory cells arranged in a matrix pattern. Multiple bit lines, multiple word lines, and multiple source lines are provided in the memory cell array 10 so as to control voltages applied to the memory cells.

The row decoder 11 is connected to the multiple word lines. The row decoder 11 decodes row addresses sent from the address decoder 15, and selects the corresponding word lines. The row decoder 11 applies appropriate voltages to the selected word lines and unselected word lines.

The sense amplifier module 12 is connected to the multiple bit lines. In data reading, the sense amplifier module 12 senses data that is read from a memory cell through bit lines. In data writing, the sense amplifier module 12 transfers write data through the bit lines. The sense amplifier module 12 is capable of performing a read operation using an all bit line (ABL) method or a bit-line shielding method. The sense amplifier module 12 performing the ABL sensing method is disclosed in U.S. Pat. No. 8,009,470, the entire contents of which are incorporated by reference herein. The sense amplifier module 12 performing the bit-line shielding sensing method is disclosed in U.S. patent application Ser. No. 12/868,196, entitled "semiconductor memory device and operation method thereof," filed on Aug. 25, 2010, the entire contents of which are incorporated by reference herein.

The input and output circuit 13 is connected to an external controller (not illustrated) or external host equipment (not illustrated), and exchanges data DT therewith. Write data input to the input and output circuit 13 from external equipment is sent to the sense amplifier module 12 via the data input and output buffer 14. Read data read by the sense amplifier module 12 is sent to the input and output circuit 13 via the data input and output buffer 14, and the read data is output to the external equipment from the input and output circuit 13. The input and output circuit 13 receives various commands CMD and various address signals ADD from the external equipment, and sends the commands CMD and the signals ADD to the data input and output buffer 14.

The address decoder 15 receives the address signals ADD which are sent from the input and output circuit 13 via the data input and output buffer 14. The address decoder 15 decodes the address signals ADD, and sends row addresses and column addresses to the sense amplifier module 12 and the column selector 16, respectively.

The column selector 16 generates column selection signals for selecting bit lines according to the column addresses received from the address decoder 15. The column selector 16 sends the generated column selection signals to the sense amplifier module 12.

The sequencer 17 is connected to the external controller (not illustrated) or the external host equipment (not illustrated), and receives external control signals therefrom. The external control signals include a chip enable signal (CE), a write enable signal (WE), a read enable signal (RE), an address latch enable signal (ALE), a command latch enable signal (CLE), and the like. The sequencer 17 receives the commands CMD which are sent from the input and output circuit 13 via the data input and output buffer 14. The sequencer 17 generates control signals for controlling a read operation, a write operation, and an erase operation based on the external control signals and the commands CMD. The control signals are sent to the row decoder 11, the sense amplifier module 12, the voltage generation circuit 18, and the like. The sequencer 17 controls various operations of the semiconductor memory device 1 using the control signals.

The voltage generation circuit 18 generates voltages required to write, read, and erase data according to the control signals sent from the sequencer 17, and supplies the generated voltages to the memory cell array 10, the row decoder 11, and the sense amplifier module 12. Accordingly, the voltages required for the various operations are applied to the bit lines, the word lines, and the source lines.

The status register 19 is connected to the input and output circuit 13 and the sequencer 17. The status register 19 holds a status for a data write operation or a data erase operation, and notifies the external controller (not illustrated) through the status whether the operation has normally completed. The status register 19 is capable of storing not only commands, addresses, or the like received from the external controller, but also various tables.

[1-1-2] Memory Cell Array 10

Figure 2:
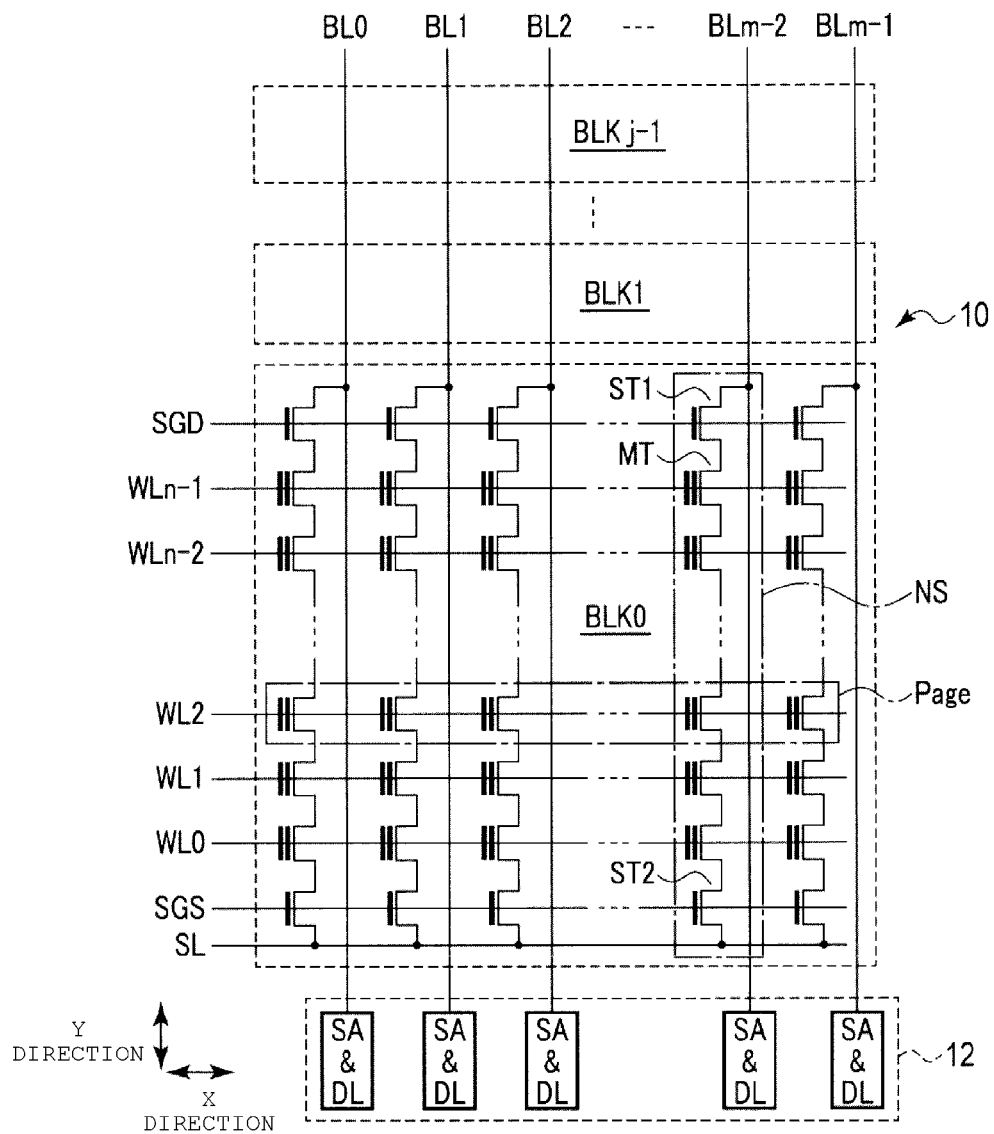
FIG. 2 is a circuit diagram of a memory cell array of the semiconductor memory device according to the first embodiment.

The circuit configuration of the memory cell array 10 will be described with reference to FIG. 2.

First, the configuration of a block BLK of the memory cell array 10 will be described. The memory cell array 10 includes j (j is a natural number of 1 or greater) blocks BLK. FIG. 2 illustrates only block BLK0 in detail, and other blocks BLK have the same configuration as the block BLK0.

The block BLK is a data erasure unit, and data in the same block BLK is collectively erased. Each of the blocks BLK includes m (m is a natural number of 1 or greater) NAND strings NS. Each of the NAND strings NS includes n (n is a natural number of 1 or greater) memory cell transistors MT, a select transistor ST1, and a select transistor ST2.

Each of the memory cell transistors MT holds data in a non-volatile manner, and includes a control gate and a charge storage layer. The memory cell transistor MT is capable of storing two-valued data (one bit) or multi-valued data (2 or more bits). The n memory cell transistors MT in each of the NAND strings are connected in series to each other between the select transistor ST1 and the select transistor ST2.

The select transistor ST1 and the select transistor ST2 are used to select a NAND string NS from which data is read and to which data is written. First ends of the select transistors ST1 and ST2 are respectively connected to one end and the other end of the n memory cell transistors MT connected in series to each other.

Hereinafter, wirings provided in the memory cell array 10 will be described. The semiconductor memory device 1 include bit lines BL, word lines WL, a source line CELSRC, select gate lines SGD, and select gate lines SGS.

The bit lines BL are provided along a Y direction, and m bit lines BL are arranged in parallel with each other. Each of the bit lines BL is connected in common to second ends of the select transistors ST1 of the NAND strings NS corresponding to the same column in the j blocks BLK.

The word lines WL are provided in an X direction, and n word lines WL in each of the blocks BLK are arrayed in parallel with each other. Each of the word line WL is connected in common to control gates of the memory cell transistors MT corresponding to the same row in the m NAND strings NS of each of the blocks BLK. Data is collectively written and read for the m memory cell transistors MT connected to the same word line WL. The unit for the data write and read operation is referred to as a page.

The source line CELSRC provided is common to multiple blocks BLK. The source line CELSRC is connected in common to second ends of the select transistors ST2 included in the m NAND strings NS of each of the blocks BLK.

The select gate lines SGD and SGS are provided in each of the blocks BLK. The select gate lines SGD and SGS are respectively connected in common to gates of the select transistors ST1 and ST2 included in the m NAND strings NS of each of the blocks BLK.

[1-1-3] Sense Amplifier Module 12

The configuration of the sense amplifier module 12 will be described with reference to FIG. 2. The sense amplifier module 12 includes multiple sense amplifiers SA and multiple data latches DL. One sense amplifier SA and one data latch DL are used in reading or writing 1-bit data.

In data reading, the sense amplifier SA detects and amplifies a potential change at an internal node (to be described in detail later), and determines data stored in the memory cell transistors MT. In data writing, the sense amplifier SA charges or discharges the corresponding bit line BL according to data held by the corresponding data latch DL.

The data latch DL temporarily holds the data determined by the sense amplifier SA in data reading. The data latch DL temporarily holds write data transferred from the input and output circuit 13 in data writing. When the memory cell transistor MT holds two or more bits of data, two or more data latches DL are provided for one sense amplifier SA.

Figure 3:
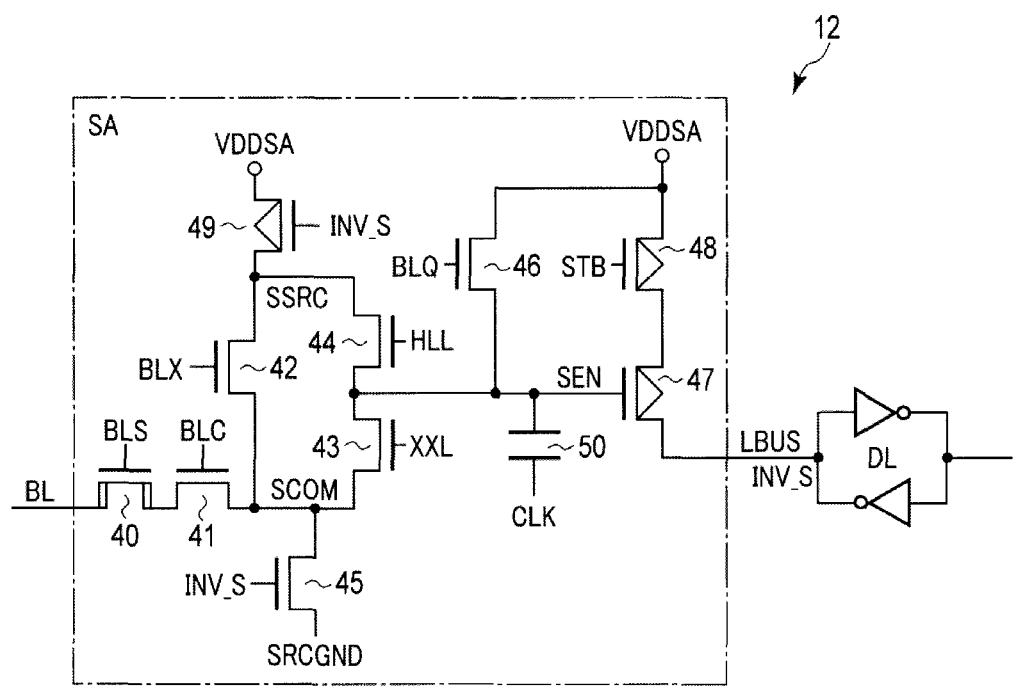
FIG. 3 is a circuit diagram of a sense amplifier module of the semiconductor memory device according to the first embodiment.

The circuit configuration of the sense amplifier SA will be described with reference to FIG. 3. Each of the sense amplifiers SA includes a high-breakdown voltage n-channel MOS transistor 40; low-voltage n-channel MOS transistors 41 to 46; low-voltage p-channel MOS transistors 47 to 49; and a capacitor 50.

A first end of the transistor 40 is connected to the corresponding bit line BL, and a control signal BLS is supplied to a gate of the transistor 40. A first end of the transistor 41 is connected to a second end of the transistor 40, and second end of the transistor 41 is connected to a node SCOM. A control signal BLC is supplied to a gate of the transistor 41. A first end of the transistor 42 is connected to the node SCOM, and a second end of the transistor 42 is connected to a node SSRC. A control signal BLX is supplied to a gate of the transistor 42. A first end of the transistor 43 is connected to the node SCOM, and a second end of the transistor 43 is connected to a node SEN. A control signal XXL is supplied to a gate of the transistor 43. A first end of the transistor 44 is connected to the node SSRC, and a second end of the transistor 44 is connected to the node SEN. A control signal HLL is supplied to a gate of the transistor 44. A first end of the transistor 45 is connected to the node SCOM, a second end of the transistor 45 is connected to a node SRCGND, and a node INV_S is connected to a gate of the transistor 45. A first end of the transistor 46 is connected to the node SEN, and a second end of the transistor 46 is connected to a power supply terminal. A control signal BLQ is supplied to a gate of the transistor 46. A first end of the transistor 47 is connected to a bus LBUS, and a gate of the transistor 47 is connected to the node SEN. A first end of the transistor 48 is connected to a second end of the transistor 47, and a second end of the transistor 48 is connected to the power supply terminal. A control signal STB is supplied to a gate of the transistor 48. A first end of the transistor 49 is connected to the node SSRC, and a second end of the transistor 49 is connected to the power supply terminal. A gate of the transistor 49 is connected to the node INV_S. A first end of the capacitor 50 is connected to the node SEN, and a clock CLK is supplied to a second end of the capacitor 50.

The sense amplifier SA is connected to the data latch DL via the bus LBUS. The data latch DL includes two inverter circuits, and is connected to the node INV_S.

A voltage applied to the power supply terminal connected to the second ends of the transistors 46, 48, and 49 is VDDSA. For example, VDDSA is 2.5 V. A voltage applied to the node SRCGND is VSS. For example, VSS is 0 V. The voltages VDDSA and VSS are not limited thereto, and can be changed to other values.

The sense amplifier module 12 may have another configuration. For example, the sense amplifier module 12 may be configured such that the transistor 47 is an n-channel MOS transistor. In this case, the data latch DL is connected to the first end of the transistor 48.

[1-1-4] Threshold Value Distributions of Memory Cell Transistor MT

Figure 4A:
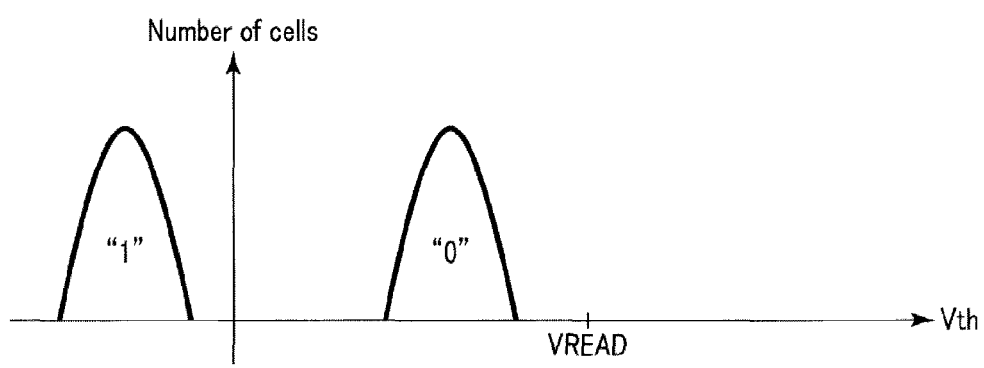
FIGS. 4A and 4B are graphs illustrating threshold voltage distributions of a memory cell of the semiconductor memory device according to the first embodiment.
Figure 4B:
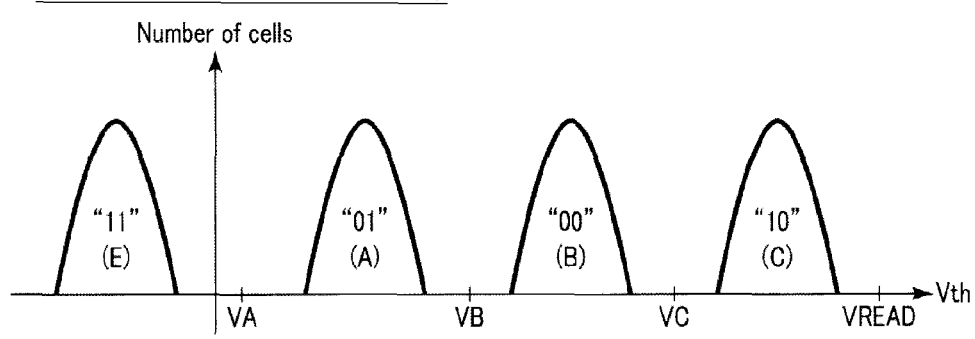

Threshold voltage distributions of the memory cell transistor MT will be described with reference to FIGS. 4A and 4B. In FIGS. 4A and 4B, the vertical axis represents the number of memory cell transistors MT, and the horizontal axis represents a threshold voltage Vth.

FIG. 4A is a graph illustrating threshold voltage distributions of the memory cell transistor MT capable of storing two-valued data (one bit). The memory cell transistor MT storing 1-bit data is capable of taking either one of two threshold values. As illustrated in FIG. 4A, a low-side threshold voltage distribution represents an erased state, and data "1" is allocated thereto. In contrast, a high-side threshold voltage distribution represents a written state, and data "0" is allocated thereto.

FIG. 4B is a graph illustrating threshold voltage distributions of the memory cell transistor MT capable of storing multi-valued data (two or more bits). In the embodiment, the memory cell transistor MT capable of storing two bits will be described as an example. The embodiment can be applied to the memory cell transistor MT capable of storing three or more bits.

As illustrated, the memory cell transistor MT capable of storing 2-bit data is capable of taking any one of four threshold values. When the threshold voltage distributions illustrated in FIG. 4B are referred to as threshold voltage distributions E, A, B, and C sequentially from a low threshold voltage side, items of 2-bit data "11", "01", "00", and "10" are respectively allocated thereto. The allocation of the items of data to the threshold voltage distributions are not limited to this example, and can be changed in various forms.

As illustrated in FIG. 4B, a read voltage VA is set between the threshold voltage distributions E and A, a read voltage VB is set between the threshold voltage distributions A and B, and a threshold voltage VC is set between the threshold voltage distributions B and C. The memory cell transistor MT to which a read voltage is applied is turned on or off according to data stored therein, depending on whether the threshold voltage thereof is higher than or lower than the applied read voltage. A read voltage VREAD is a voltage higher than the upper limit of the highest threshold voltage distribution, and the memory cell transistor MT to which the read voltage VREAD is applied, is turn on regardless of data stored therein.

[1-2] Operation

[1-2-1] ABL Sensing Method

Figure 5:
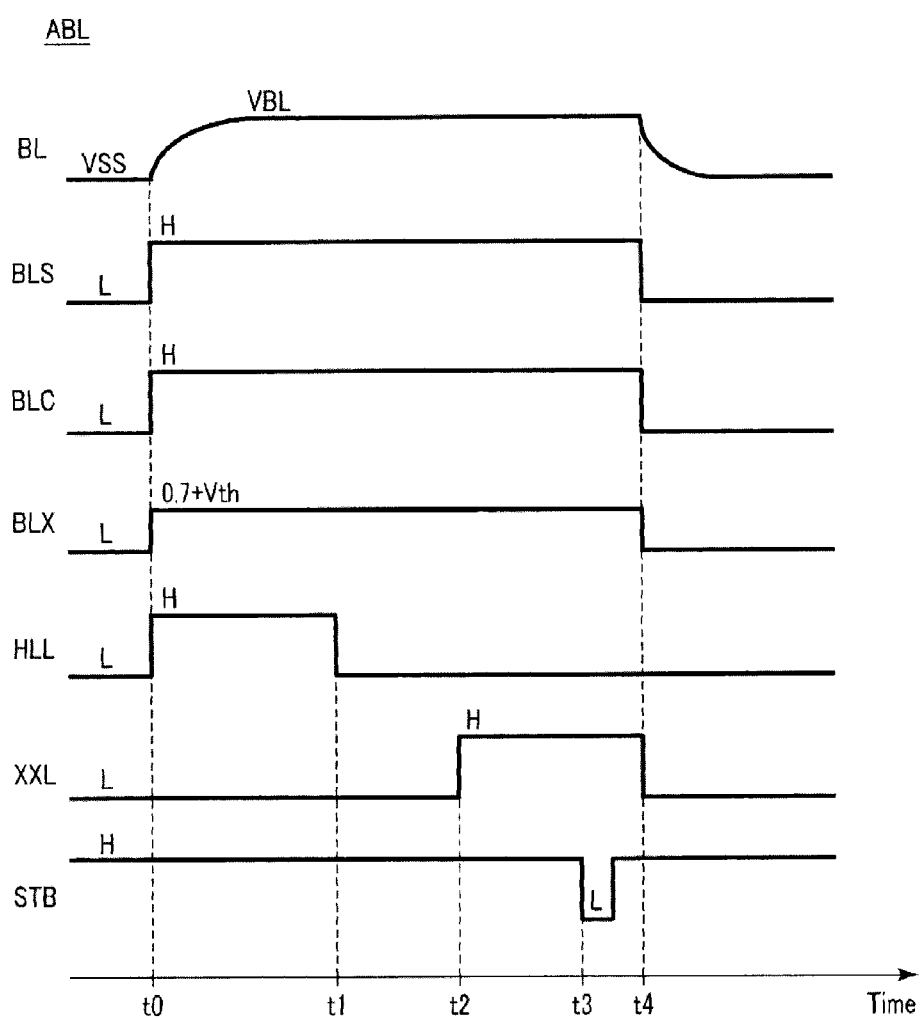
FIG. 5 is a timing chart illustrating a read operation performed by the semiconductor memory device according to the first embodiment using an ABL (all bit line) method.

An ABL sensing method will be described with reference to FIG. 5. The ABL sensing method is a method by which a read operation is performed using all of the bit lines BL.

At time t0, the sequencer 17 turns on the transistors 40, 41, and 44 by setting the control signals BLS, BLC, and HLL to an "H" level. For example, the sequencer 17 sets the voltage of the control signal BLX to 0.7 V+Vth. Accordingly, the transistor 42 clamps the potential difference between the node SSRC and the node SCOM at a predetermined voltage. The node INV_S is at an "L" level. The transistor 49 is in an ON state, and the transistor 45 is in an OFF state. Accordingly, the bit line BL is charged via the transistors 49, 42, 41, and 40, and the voltage of the bit line BL goes to VBL. For example, VBL is 0.5 V. The capacitor 50 is charged via the transistors 49 and 44. Accordingly, the voltage of the node SEN is increased, and the node SEN goes to an "H" level. The voltage of the control signal BLX and the charged voltage of the bit line BL are not limited to those described above, and can be changed to various values.

At time t1, the sequencer 17 turns off the transistor 44 by setting the control signal HLL to an "L" level.

At time t2, the sequencer 17 turns on the transistor 43 by setting the control signal XXL to an "H" level. When a select memory cell is in an ON state, the capacitor 50 is discharged to the bit line BL via the transistors 43, 41, and 40. Accordingly, the voltage of the node SEN is decreased to an "L" level, and the transistor 47 is turned on. When a selected memory cell is in an OFF state, the capacitor 50 is not discharged, and the voltage of the node SEN is maintained at an "H" level. When the voltage of the node SEN is maintained at an "H" level, the transistor 47 is in an OFF state.

At time t3, the sequencer 17 turns on the transistor 48 by setting the control signal STB to an "L" level. The transistor 47 is turned on when the selected memory cell is in an ON state, and so the node INV_S is charged via the transistors 48 and 47, and the voltage of the node INV_S goes to an "H" level. On the other hand, the transistor 47 is turned off when the selected memory cell is in an OFF state, and so the voltage of the node INV_S is maintained at an "L" level. Subsequently, the sequencer 17 turns off the transistor 48 by setting the control signal STB to an "H" level. Accordingly, the node INV_S of the data latch DL is capable of latching a read result.

At time t4, the sequencer 17 turns off the transistors 40, 41, 42, and 43 by setting the control signals BLS, BLC, BLX, and XXL to an "L" level. As a result, the bit line BL is discharged, and the voltage of the bit line BL goes to VSS. The sequencer 17 ends the read operation.

[1-2-2] Method of Reading Multiple-valued Data

The semiconductor memory device 1 according to the first embodiment may continuously perform read operations using multiple read voltages when reading multiple-valued data stored in a memory cell. In the semiconductor memory device 1, a method (Method 1) of changing voltages applied to the word lines WL, and a method (Method 2) of changing a voltage applied to the source line CELSRC can be used so as to apply multiple read voltages to a memory cell. In the following example to be described below, data determination (AR operation) using a read voltage VA and data determination (CR operation) using a read voltage VC are continuously performed.

Figure 6:
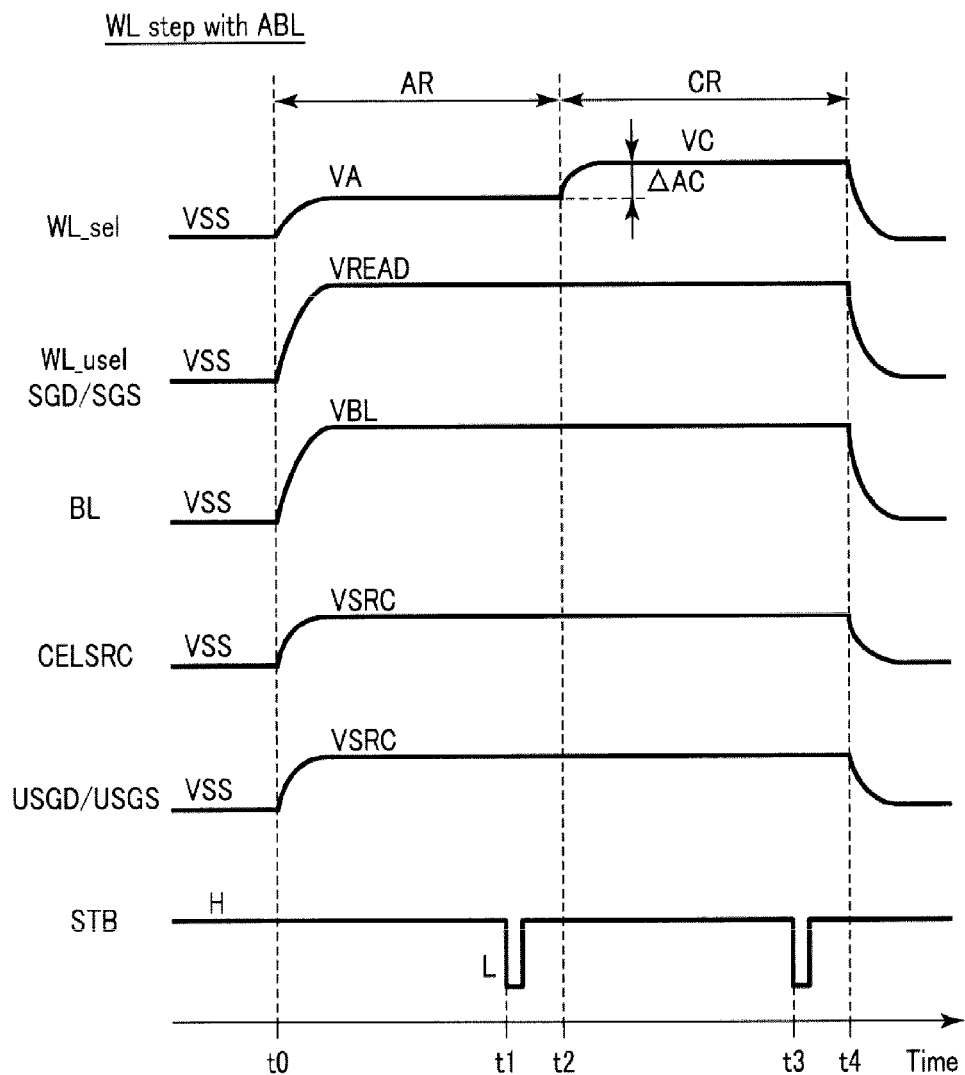
FIG. 6 is a timing chart illustrating the read operation performed by the semiconductor memory device according to the first embodiment using the ABL method.

A read operation according to Method 1 will be described with reference to FIG. 6. In FIG. 6, for illustrative purposes, a selected word line is denoted by WL_sel, an unselected word line is denoted by WL_usel, an unselected select gate line SGD is denoted by USGD, and an unselected select gate line SGS is denoted by USGS. The difference between the read voltage VC and the read voltage VA is deemed to be ΔAC.

First, the AR operation is performed.

At time t0, the row decoder 11 sets the voltage of the selected word line WL_sel to VA, the voltages of the unselected word lines WL_usel and the select gate lines SGD and SGS to VREAD, and the voltages of the source line CELSRC and the unselected select gate lines USGD and USGS to VSRC. VSRC is a voltage that is applied to the source line CELSRC in a read operation, and can be changed to various values according to the read method, and a determination threshold voltage. The sense amplifier module 12 charges the bit line BL, and the voltage of the bit line BL goes to VBL.

At time t1, the sequencer 17 sets the control signal STB to an "L" level, and the sense amplifier module 12 determines whether the threshold voltage of a selected memory cell is lower than or equal to the read voltage VA. Subsequently, the sequencer 17 latches a read result in the data latch DL by setting the control signal STB to an "H" level, and ends the AR operation.

Subsequently, the CR operation is performed.

At time t2, the row decoder 11 sets the voltage of the selected word line WL_sel to VC. At this time, the voltage of the selected word line WL_sel is stepped up by AAC from VA to VC.

At time t3, the sequencer 17 sets the control signal STB to an "L" level, and determines a read result. Subsequently, the sequencer 17 latches the read result in the data latch DL by setting the control signal STB to an "H" level, and ends the CR operation.

At time t4, the row decoder 11 sets the voltage of the selected word line WL_sel, the unselected word lines WL_usel, the source line CELSRC, the select gate lines SGD and SGS, and the unselected select gate lines USGD and USGS to VSS, and ends the read operation.

Figure 7:
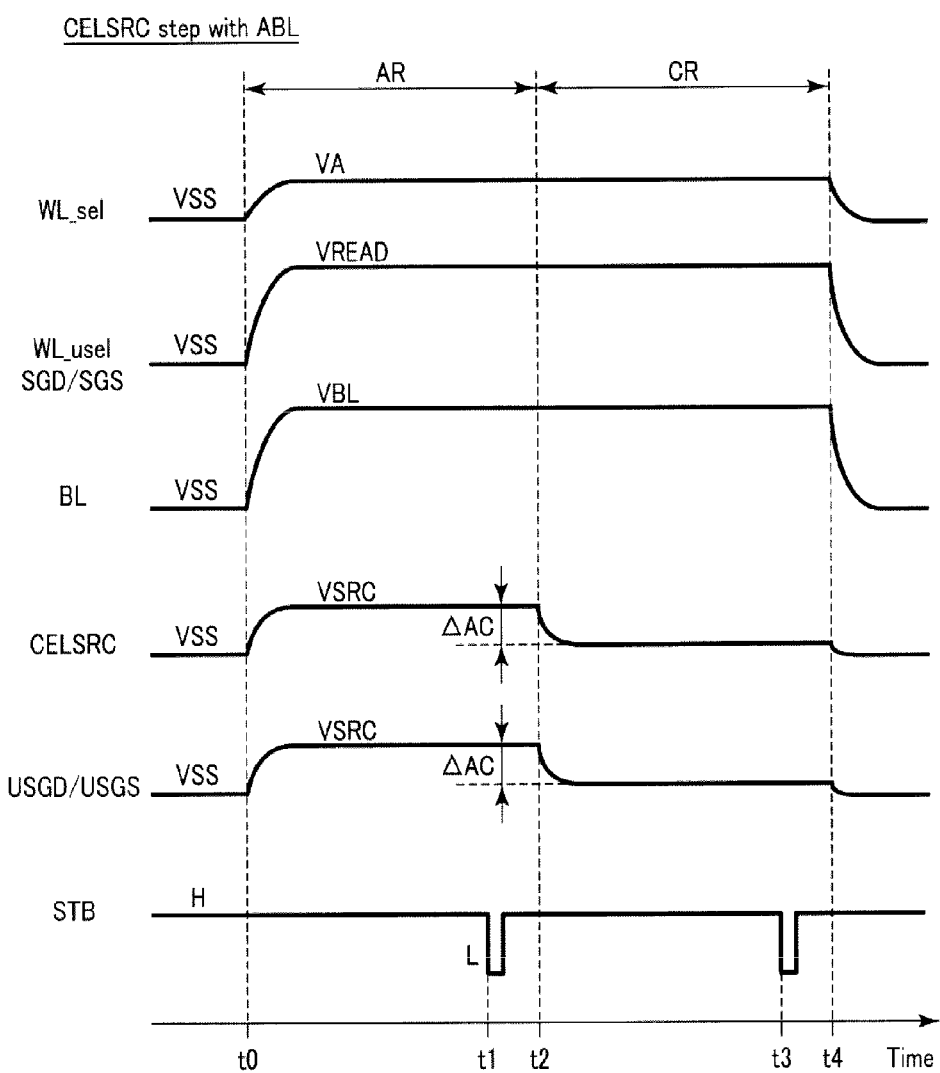
FIG. 7 is a timing chart illustrating the read operation performed by the semiconductor memory device according to the first embodiment using the ABL method.

Hereinafter, a read operation according to Method 2 will be described with reference to FIG. 7.

At the start of the read operation, the voltages of the selected word line WL_sel, the unselected word lines WL_usel, the bit line BL, the source line CELSRC, and the unselected select gate lines USGD and USGS are VSS. The control signal STB is set to an "H" level.

First, the AR operation is performed.

At time t0, the row decoder 11 sets the voltage of the selected word line WL_sel to VA, the voltages of the unselected word lines WL_usel and the select gate lines SGD and SGS to VREAD, and the voltages of the source line CELSRC and the unselected select gate lines USGD and USGS to VSRC. The sense amplifier module 12 charges the bit line BL, and the voltage of the bit line BL goes to VBL.

At time t1, the sequencer 17 sets the control signal STB to an "L" level, and determines a read result. Subsequently, the sequencer 17 latches the read result in the data latch DL by setting the control signal STB to an "H" level, and ends the AR operation.

Subsequently, the CR operation is performed.

At time t2, the row decoder 11 steps down the voltage of each of the source line CELSRC and the unselected select gate lines USGD and USGS by ΔVC. In this case, VA−(VSRC−ΔAC) is equal to VC−VSRC. Accordingly, the voltage difference between the control gate and the channel of a selected memory cell is the same as in the CR operation illustrated in FIG. 6. Voltages applied to the unselected select gate line USGD and USGS are set to that of the source line CELSRC, and thus an operation speed is improved.

At time t3, the sequencer 17 sets the control signal STB to an "L" level, and determines a read result. Subsequently, the sequencer 17 latches the read result in the data latch DL by setting the control signal STB to an "H" level, and ends the CR operation.

At time t4, the row decoder 11 sets the voltage of the selected word line WL_sel, the unselected word lines WL_usel, the source line CELSRC, the select gate lines SGD and SGS, and the unselected select gate lines USGD and USGS to VSS, and ends the read operation.

When the voltage of the source line CELSRC is changed in the read operation, current flowing through the memory cell transistors MT connected to the unselected word lines is increased by a very small amount along therewith. The increased amount of current is corrected by reducing the sense time of the sense amplifier module 12. The increased amount of current may be corrected by changing the voltage of the control signal BLC, and limiting the amount of current supplied to the bit line BL.

[1-3] Effects of First Embodiment

When multiple-valued data stored in a memory cell is continuously read in a semiconductor memory device, as illustrated in FIG. 6, the read data is determined by stepping up a voltage applied to the selected word line WL. However, since the wiring resistance of a word line is increased due to high circuit integration, a large delay may be caused by the word line, thereby leading to an operation delay.

When continuously reading data, the semiconductor memory device 1 according to the first embodiment changes a voltage applied to a selected memory cell by stepping down the voltage of the source line CELSRC. Specifically, the semiconductor memory device 1 applies a desired potential difference between the control gate and the channel of the memory cell transistor MT by fixing a voltage applied to the corresponding word line WL, and changing the voltage level of the source line CELSRC. Since the source line CELSRC is provided with many shunt wirings, the source line CELSRC has wiring resistance lower than that of the word line WL, and a delay smaller than that of the word line WL.

Accordingly, in the semiconductor memory device 1 according to the first embodiment, it is possible to reduce a delay caused by wirings, and to improve the speed of a continuous read operation.

When a high threshold voltage is determined and then a low threshold voltage is determined, for example, when the AR operation and the CR operation are performed in a reverse sequence, it is possible to obtain the same effects by stepping up the voltage of the source line CELSRC.

[2] Second Embodiment

The semiconductor memory device 1 according to a second embodiment performs a read operation using a bit-line shielding method. The second embodiment is different in a read operation method from the first embodiment. Hereinafter, only the points of difference of the second embodiment with respect to the first embodiment will be described.

[2-1] Operation

[2-1-1] Bit-Line Shielding Sensing Method

Figure 8:
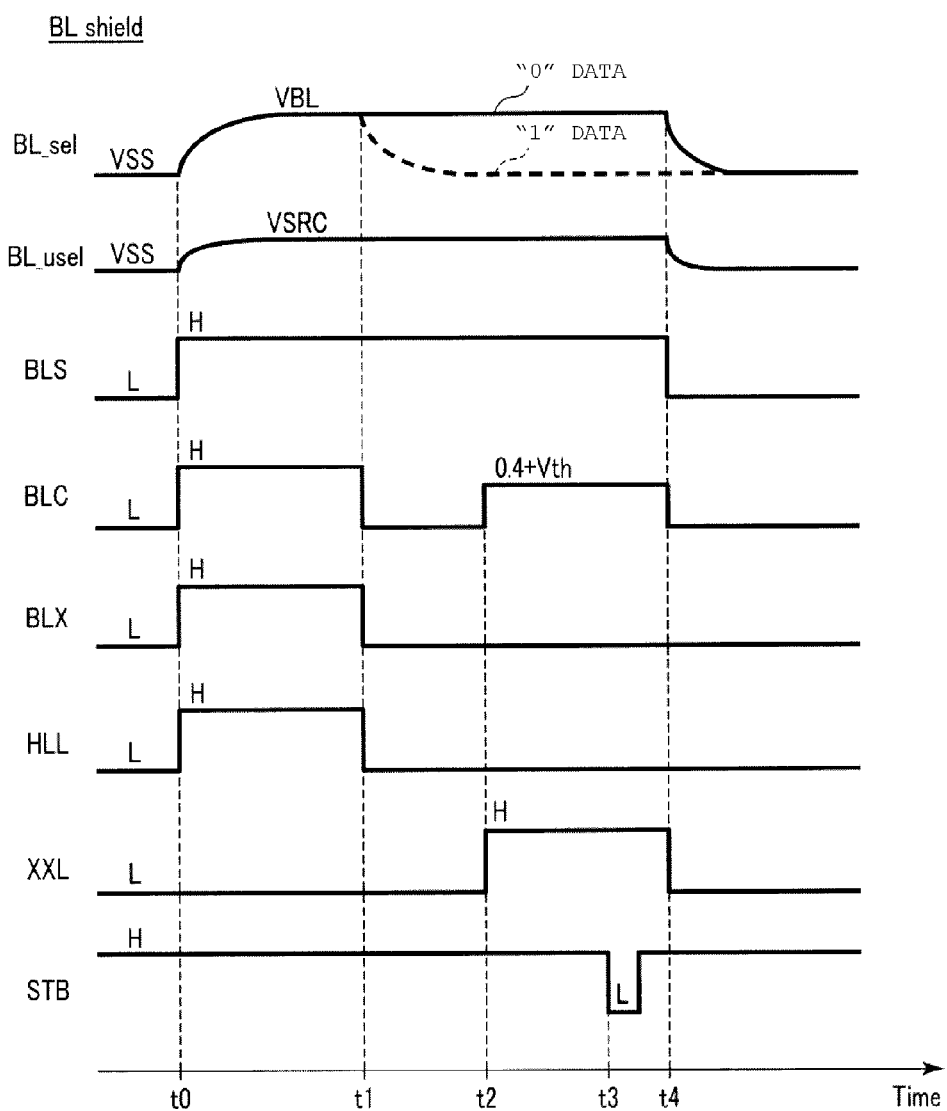
FIG. 8 is a timing chart illustrating a read operation performed by a semiconductor memory device according to a second embodiment using a bit-line shielding method.

A bit-line shielding sensing method will be described with reference to FIG. 8. A read operation is performed by selecting the half of the bit lines BL in the bit-line shielding sensing method.

In the read operation using the bit-line shielding method, a selected bit line and an unselected bit line are respectively deemed to be BL_sel and BL_usel. The selected bit lines BL_sel are the bit lines BL arrayed in even-numbered columns, and the unselected bit lines BL_usel are the bit lines BL arrayed in odd-numbered columns. This combination can be changed in various forms, and for example, a bit line in every fourth column among the arrayed bit lines BL may be set as the selected bit line BL_sel.

At time t0, the sequencer 17 turns on the transistors 40, 41, 42, and 44 by setting the control signals BLS, BLC, BLX, and HLL to an "H" level.

The node INV_S of the sense amplifier module 12, which is connected to the selected bit line BL_sel, is at an "L" level. The transistor 49 is in an ON state, and the transistor 45 is in an OFF state. Accordingly, the selected bit line BL_sel is charged via the transistors 49, 42, 41, and 40, and the voltage of the selected bit line BL_sel goes to VBL. The capacitor 50 is charged via the transistors 49 and 44. Accordingly, the voltage of the node SEN is increased, and the node SEN goes to an "H" level. When the bit line BL is charged, the signal BLC is set to 0.5 V+Vth. The voltage of the control signal BLC is not limited to that value, and can be changed to various values.

The node INV_S of the sense amplifier module 12, which is connected to the unselected bit line BL_usel, is at an "H" level. The transistor 49 is in an OFF state, and the transistor 45 is in an ON state. Accordingly, the unselected bit line BL_usel is connected to the node SRCGND via the transistors 45, 41, and 40. The capacitor 50 is connected to the node SRCGND via the transistors 44, 42, and 45. Accordingly, the unselected bit line BL_usel and the capacitor 50 are not charged, and the unselected bit line BL_usel serves as a shielded line reducing noise in the read operation. The voltage of the unselected bit line BL_usel at this time goes to VSRC that is a voltage applied to the source line CELSRC.

At time t1, the sequencer 17 turns off the transistors 41, 42, and 44 by setting the control signals BLC, BLX, and HLL to an "L" level. When the transistor 41 is turned off, the voltage of the bit line BL is changed according to data stored in a selected memory cell.

When the selected memory cell stores data "0", the selected memory cell is in an OFF state. In this case, the voltage of the selected bit line BL_sel is maintained at VBL.

When the selected memory cell stores data "1", the selected memory cell is in an ON state. In this case, electrical charges charged in the selected bit line BL_sel are discharged to the source line CELSRC. Accordingly, the voltage of the source line BL_sel goes to VSS.

At time t2, the sequencer 17 turns on the transistor 43 by setting the control signal XXL to an "H" level. The sequencer 17 sets the voltage of the control signal BLC to 0.4 V+Vth. Accordingly, the transistor 41 clamps the potential difference between the node SCOM and the bit line BL at a predetermined voltage. The voltage of the control signal BLC is not limited to that value, and can be changed to various values.

When the selected memory cell is in an ON state, the capacitor 50 is discharged to the bit line BL via the transistors 43, 41, and 40. Accordingly, the voltage of the node SEN is decreased to an "L" level, and the transistor 47 is turned on.

When a selected memory cell is in an OFF state, the capacitor 50 is not discharged, and the voltage of the node SEN is maintained at an "H" level. Accordingly, the voltage of the node SEN is maintained at an "H" level, and the transistor 47 is turned off.

At time t3, the sequencer 17 turns on the transistor 48 by setting the control signal STB to an "L" level. The transistor 47 is turned on when the selected memory cell is in an ON state, and so the node INV_S is charged via the transistors 48 and 47, and the voltage of the node INV_S goes to an "H" level. On the other hand, the transistor 47 is turned off when a select memory cell is in an OFF state, and so the voltage of the node INV_S is maintained at an "L" level. Subsequently, the sequencer 17 turns off the transistor 48 by setting the control signal STB to an "H" level. Accordingly, the node INV_S of the data latch DL is capable of latching a read result.

At time t4, the sequencer 17 turns off the transistors 40, 41, and 43 by setting the control signals BLS, BLC, and XXL to an "L" level. As a result, the bit line BL is discharged, and the voltage of the bit line BL goes to VSS.

The sequencer 17 ends the read operation.

[2-1-2] Method of Reading Multi-Valued Data

Similar to the first embodiment, read operations according to Method 1 and Method 2 can be used in the semiconductor memory device 1 according to the second embodiment. In the following example to be described below, the AR operation and the CR operation are continuously performed.

Figure 9:
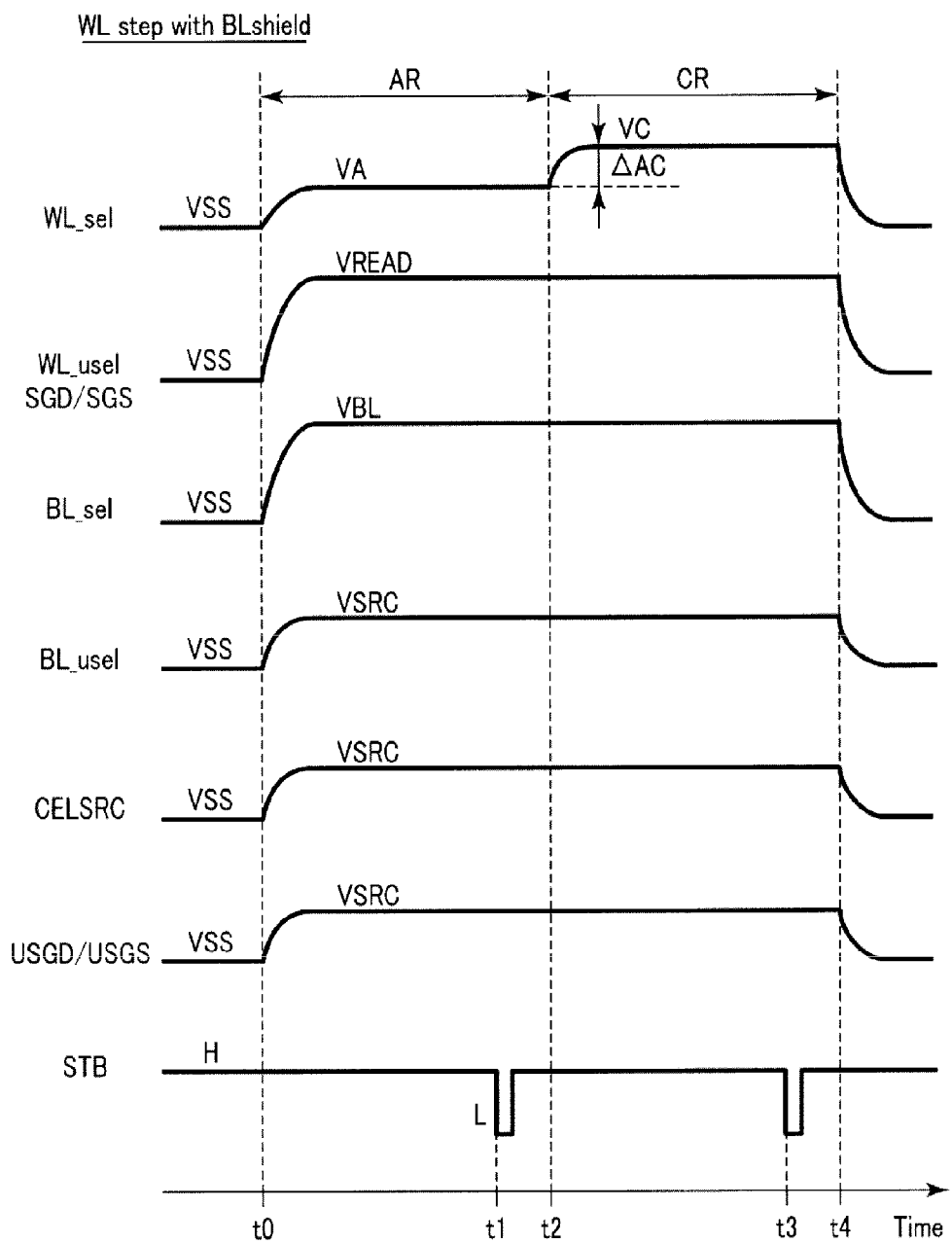
FIG. 9 is a timing chart illustrating the read operation performed by the semiconductor memory device according to the second embodiment using the bit-line shielding method.

A read method, Method 1, using the BL shielding method, will be described with reference to FIG. 9.

At time t0, the sense amplifier module 12 charges the selected bit line BL_sel, and the voltage of the selected bit line BL goes to VBL. The unselected bit line BL_usel is charged from the source line CELSRC, and the voltage of the unselected bit line BL_usel goes to VSRC. Other portions of the operation are the same as those illustrated in FIG. 6. The operation illustrated in FIG. 9 is different in a data sensing method from that illustrated in FIG. 6.

Figure 10:
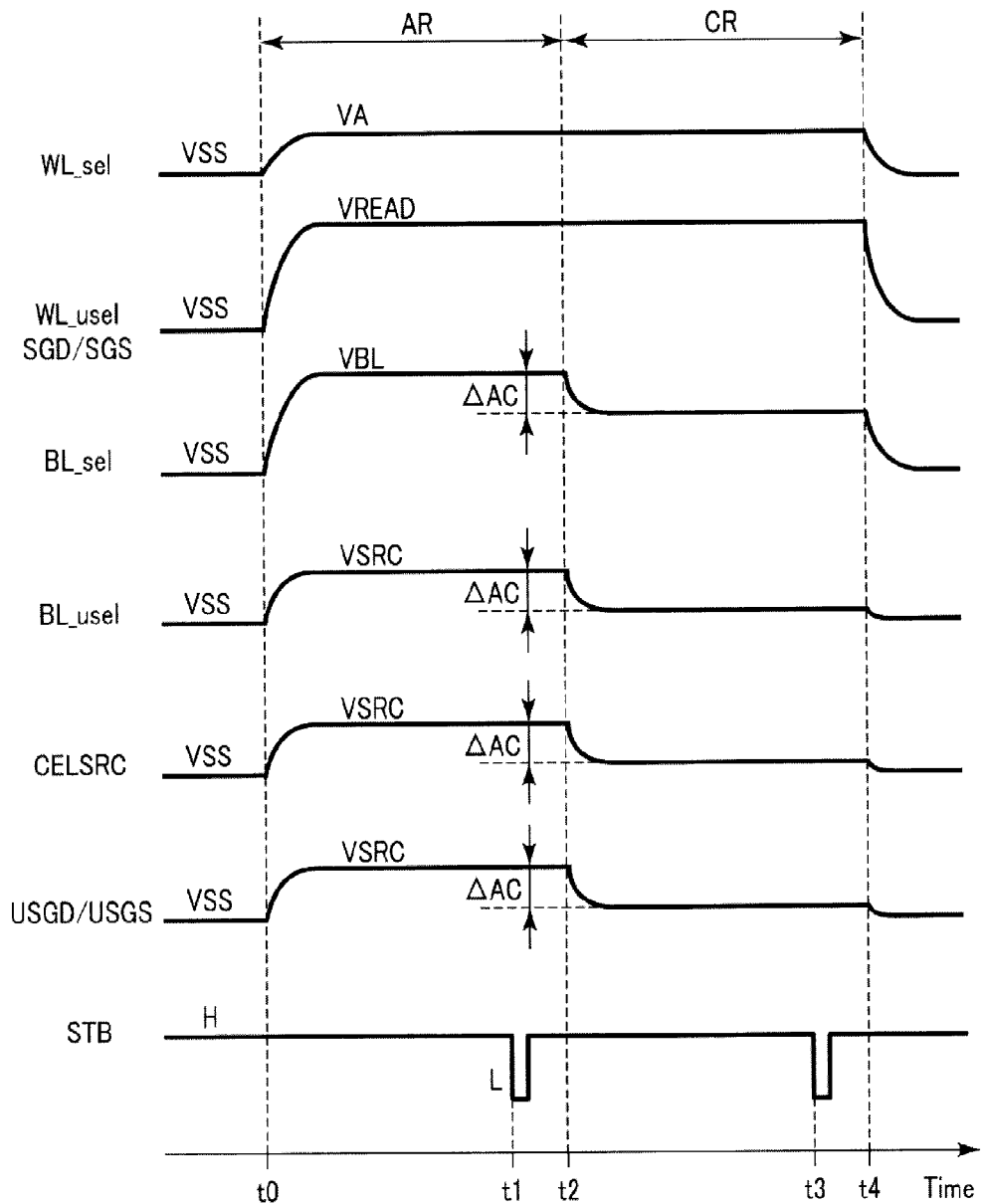
FIG. 10 is a timing chart illustrating the read operation performed by the semiconductor memory device according to the second embodiment using the bit-line shielding method.

Hereinafter, a read operation, Method 2, using the BL shielding method, will be described with reference to FIG. 10.

At time t0, the sense amplifier module 12 charges the bit line BL, and the voltage of the bit line BL goes to VBL. The unselected bit line BL_usel is charged from the source line CELSRC, and the voltage of the unselected bit line BL_usel goes to VSRC.

At time t2, along with the stepping down of the voltage of the source line CELSRC, the voltage of the selected bit line BL_sel goes to VBL−ΔAC and the voltage of the unselected bit line BL_usel goes to VSRC−ΔAC. Other portions of the operation are the same as those illustrated in FIG. 7. The operation illustrated in FIG. 10 is different in a data sensing method from that illustrated in FIG. 7.

Similar to the first embodiment, when the voltage of the source line CELSRC is changed in the read operation, current flowing through the memory cell transistors MT connected to the unselected word lines is increased by a very small amount along therewith. The increased amount of current is corrected by the same methods as in the first embodiment.

[2-2] Effects of Second Embodiment

In the semiconductor memory device 1 according to the second embodiment, it is possible to obtain the same effects as in the first embodiment by stepping down the voltage of the source line CELSRC.

Since the bit-line shielding sensing method is used in the semiconductor memory device 1 according to the second embodiment, the semiconductor memory device 1 is capable of outputting read data at a higher speed than in the first embodiment, and to reduce power consumption.

[3] Third Embodiment

The semiconductor memory device 1 according to a third embodiment performs the read operation according to the first embodiment and the read operation according to the second embodiment by using multiple commands.

The command CMD used in the read operation of the semiconductor memory device 1 will be described with reference to FIG. 11. The semiconductor memory device 1 is capable of performing two types of read operations. A read operation corresponding to a command CMDA is referred to as a read operation A, and a read operation corresponding to a command CMDB is referred to as a read operation B. The read operation A is a read operation according to Method 1 using the ABL method, and the read operation B is a read operation according to Method 2 according to the ABL method. The aforementioned command allocation is referred to as Case 1.

When the sequencer 17 receives the command CMDA, and subsequently receives the address signal ADD, the sequencer 17 executes the read operation A. For example, a read time $T_RA$ is 60 μs. In contrast, when the sequencer 17 receives the command CMDB, and subsequently receives the address signal ADD, the sequencer 17 executes the read B. For example, a read time $T_RB$ is 45 μs. As such, the read operation B is a high-speed read operation compared to the read operation A. In addition, the read times are different between the read operations used.

Figures 11, 12:
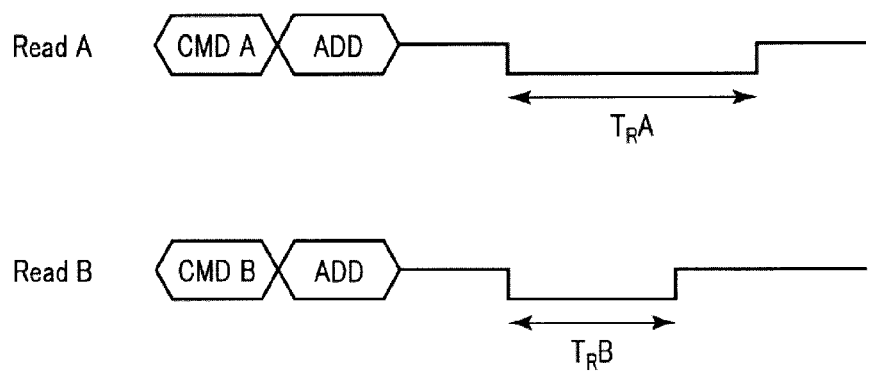
FIG. 11 is a view illustrating a command sequence of a semiconductor memory device according to a third embodiment.
FIG. 12 is a table illustrating combinations of commands used in a read operation of the semiconductor memory device according to the third embodiment.

As illustrated in FIG. 12, the read operation according to the first embodiment and the read operation according to the second embodiment can be allocated to different commands CMD. In addition to the combination of Case 1, as in Case 2, a read operation according to Method 1 using the ABL method may correspond to the command CMDA, and a read operation according to Method 2 using the BL shielding method may correspond to the command CMDB. As in Case 3, a read operation according to Method 1 using the BL shielding method may correspond to the command CMDA, and a read operation according to Method 2 using the ABL method may correspond to the command CMDB. Additional combinations illustrated in FIG. 12 may be adopted.

As such, in the semiconductor memory device 1 according to the third embodiment, the ABL method, the bit-line shielding method, a read method called Method 1, and a read method called Method 2 may be combined together and used. Accordingly, in the semiconductor memory device 1 according to the third embodiment, it is possible to change the type of a read operation corresponding to the command CMD, and to select a read operation adapted for the use according to a customer's demand.

The number of read operations and the number of corresponding commands are not limited to those numbers in the embodiment, and three or more types of read operations and corresponding commands may be used. In this case, similarly, it is possible to select a read operation adapted for the use by allocating different read operations to the commands CMD.

[4] Fourth Embodiment

In the semiconductor memory device 1 according to a fourth embodiment, when the threshold voltage of a memory cell storing data is shifted, the read operation according to the second embodiment is applied to a second read operation of searching for an optimum read voltage value. Hereinafter, the points of difference of the fourth embodiment with respect to the first to third embodiments will be described.

[4-1] Regarding Shift of Threshold Voltage

Figure 13:
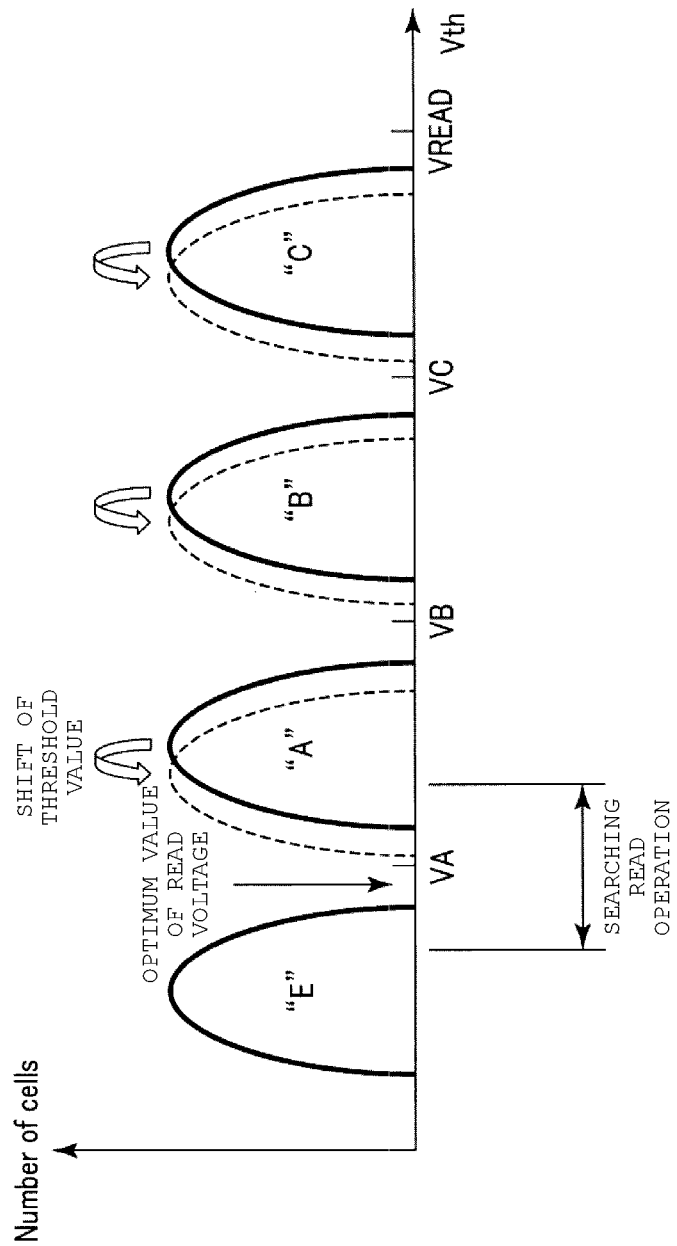
FIG. 13 is a graph illustrating the shift of the threshold voltage of a memory cell of a semiconductor memory device according to a fourth embodiment.

The shift of the threshold voltage of the memory cell transistor MT will be described with reference to FIG. 13. The memory cell transistor MT is affected by program disturbance after writing, and read disturbance after reading. For example, when the memory cell transistor MT is affected thereby, as illustrated in FIG. 13, the threshold voltage of the memory cell transistor MT may be shifted to a negative side.

In this case, it is not possible to accurately read data from the memory cell transistor MT using a preset read voltage, and a bit error rate may be increased. The bit error rate represents the percentage of error bits contained in the read data.

A shift read operation in which a read voltage is optimized is executed for a page, the bit error rate of which is increased. Accordingly, it is possible to reduce the number of error bits in data read from the memory cell transistor MT. The shift read operation is a read operation that is performed using a voltage value shifted from a preset read voltage value. The optimum value of a read voltage used in the shift read operation is determined by the second read operation.

[4-2] Second Read Operation

Hereinafter, the second read operation will be described.

The second read operation is a read operation which is executed when the bit error rate exceeds an arbitrary value, and in which a search is performed to find the threshold voltage distribution of the memory cell transistor MT. The bit-line shielding read method is used in the second read operation. In the second read operation, a read voltage is changed by a predetermined amount each time, and data is read using each of the changed read voltages. In many cases, the sequencer 17 provides a search area centered around a read voltage corresponding to each of threshold voltage distributions, and executes the second read operations using each of the read voltages. In the search area, a voltage at which the number of error bits is the minimum value is determined as an optimum read voltage, and the shift read operation is executed using the optimum value.

Figure 14:
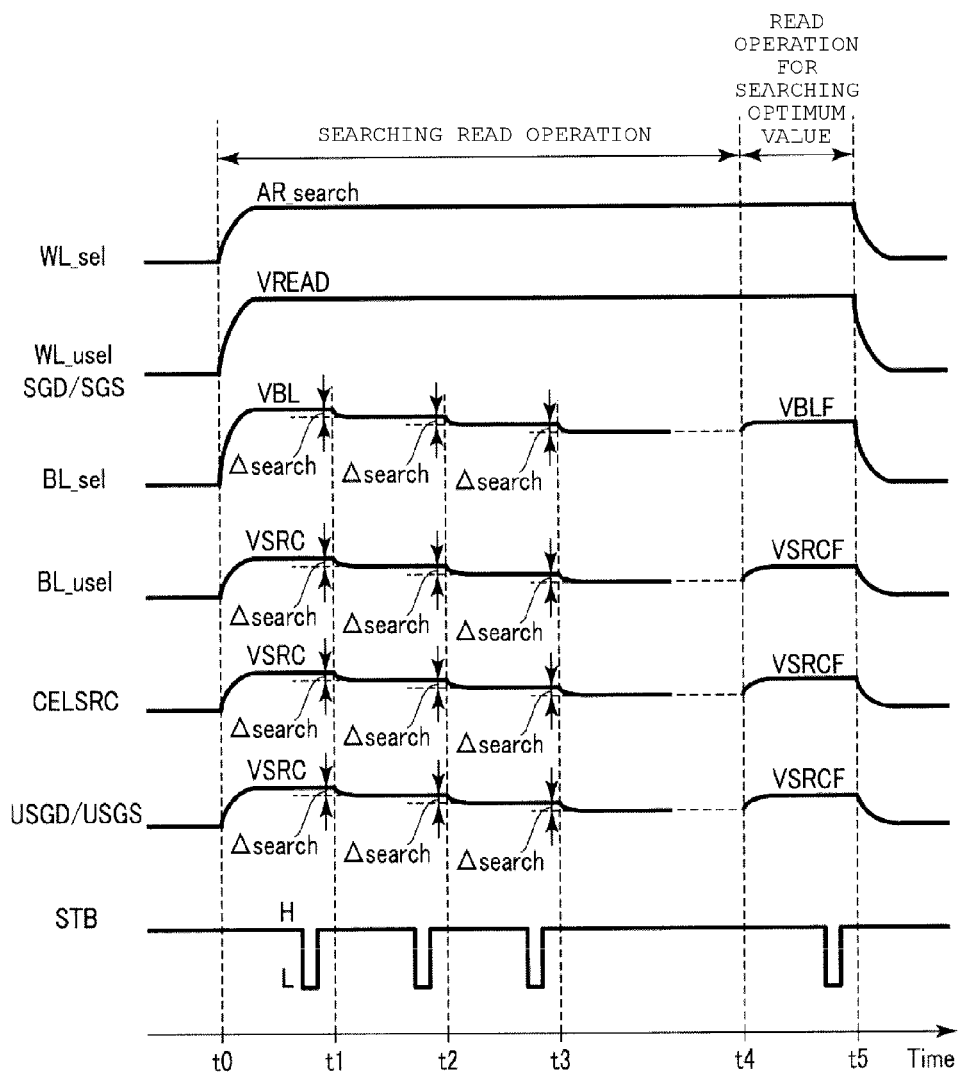
FIG. 14 is a timing chart illustrating a second read operation of the semiconductor memory device according to the fourth embodiment.

In the following description to be given with reference to FIG. 14, the second read operation of searching for the optimum value of the read voltage VA, and the shift read operation in which the read voltage is optimized are performed for the memory cell transistor MT connected to a bit line BLe.

First, the second read operation is performed.

At time t0, the row decoder 11 sets the voltage of a selected word line WL_sel to AR_search. AR_search is higher than VA, and for example, is set to a value within the threshold voltage distribution A.

The row decoder 11 sets the voltages of unselected word lines WL_usel and the select gate lines SGD and SGS to VREAD, and the voltages of the source line CELSRC and the unselected select gate lines USGD and USGS to VSRC. VSRC is set in such a way that the value of (AR_search−VSRC) is within the threshold voltage distribution E.

The sense amplifier module 12 charges the selected bit line BLe_sel, and the voltage of the selected bit line BLe_sel goes to VBL. In contrast, the unselected bit line BLo_usel is charged from the source line CELSRC, and the voltage of the unselected bit line BLo_usel goes to VSRC. The sense amplifier module 12 senses a read result for a selected memory cell up to time t1.

At time t1, the row decoder 11 steps down the voltages of the source line CELSRC and the unselected select gate line USGD and USGS by Δsearch. It is possible to set Δsearch to an arbitrary value. The voltages of the selected bit line BLe_sel and the unselected bit line BLo_usel are decreased by Δsearch along with a decrease in the voltage of the source line CELSRC. The sense amplifier module 12 senses a read result for the selected memory cell up to time t2.

At time t2, the row decoder 11 steps down the voltages of the source line CELSRC and the unselected select gate line USGD and USGS by Δsearch. The voltages of the selected bit line BLe_sel and the unselected bit line BLo_usel are decreased by Δsearch along with a decrease in the voltage of the source line CELSRC. The sense amplifier module 12 senses a read result for the selected memory cell up to time t3.

From time t3 to time t4, the stepping down of the voltages of the source line CELSRC and the unselected select gate lines USGD and USGS, and the sensing of read results are repeated. The number of repetition of each of these operations can be set to an arbitrary number. The voltage difference between the selected word line WL_sel and the selected bit line BLe_sel after the stepping down of the voltages is repeated is set to a value within the threshold voltage distribution A.

A threshold voltage distribution including valley areas of the adjacent threshold voltage distributions E and A is detected via these operations. The minimum threshold voltage is calculated from the detected threshold voltage distribution, and is set to VSRCF which is an optimum read voltage value. VSRCF is the optimum value of a voltage applied to the source line CELSRC in the read operation in which the voltage applied to the source line CELSRC is changed. An example of a method of obtaining an optimum read voltage value is disclosed in Japanese Patent Application No. 2011/271393 entitled "semiconductor memory device" filed on Dec. 12, 2011. The entire content of this patent application is incorporated in this specification by reference.

Subsequently, the shift read operation is performed.

At time t4, the row decoder 11 sets the voltages of the source line CELSRC and the unselected select gate lines USGD and USGS to VSRCF. At this time, the voltage of the selected word line WL_sel is maintained at AR_search, and the voltage of the selected bit line BLe_sel goes to VBLF. The value of the voltage VBLF is VBL−(VSRC−VSRCF). The sense amplifier module 12 senses a read result for the selected memory cell up to time t5.

At time t5, the row decoder 11 sets the voltage of the selected word line WL_sel, the unselected word line WL_usel, the select gate lines SGD and SGS, the source line CELSRC, and the unselected select gate lines USGD and USGS to VSS, and ends the second read operation and the shift read operation.

[4-3] Effects of Fourth Embodiment

In the semiconductor memory device 1 according to the fourth embodiment, the read operation according to the second embodiment is applied to the second read operation of searching an optimum read voltage value. Accordingly, in the semiconductor memory device 1 according to the fourth embodiment, it is possible to improve the speed of the second read operation.

The second read operation may be performed by stepping up the voltage of the source line CELSRC, instead of stepping down as described above. In this case, for example, when the second read operation is performed to search for the optimum value of VA, VSRC is set in such a way that the value of (AR_search−VSRC) is within the threshold voltage distribution A. The voltage difference between AR_search and the source line CELSRC after the stepping up of the voltages is repeated is set to a value within the threshold voltage distribution E.

When a result of the second read operation is applied to the read operation in which a voltage applied to the word line WL is changed, VF set to satisfy (AR_search−VSRCF=VF−VSRC) is an optimum read voltage value.

Also in the second read operation of searching for the optimum values of the read voltages VB and VC, it is possible to search for the optimum values using the same method by changing the initial values of voltages applied to the selected word line WL_sel and the source line CELSRC. Similarly, the embodiment can be applied to a configuration in which the memory cell transistor MT stores three or more bits of data.

[5] Fifth Embodiment

In the semiconductor memory device 1 according to a fifth embodiment, the read operations in the first and second embodiments are applied to verify a selected memory cell in a write operation using the QPW method. Hereinafter, only the points of difference of the fifth embodiment with reference to the first to fourth embodiments will be described.

[5-1] Regarding QPW Method

The QPW method in the semiconductor memory device 1 will be described with reference to FIG. 15. When the quick pass write (QPW) method is used in a write operation, it is possible to decrease the width of the threshold voltage distribution of a selected memory cell to which data is written.

A program operation and a verify operation are performed in a write operation in which data is written to a selected memory cell. The program operation is an operation of shifting the threshold voltage of the selected memory cell by applying a program pulse voltage VPGM to the selected memory cell. The verify operation is an operation of confirming the threshold voltage of the selected memory cell via a read operation using a verify voltage.

Figure 15:
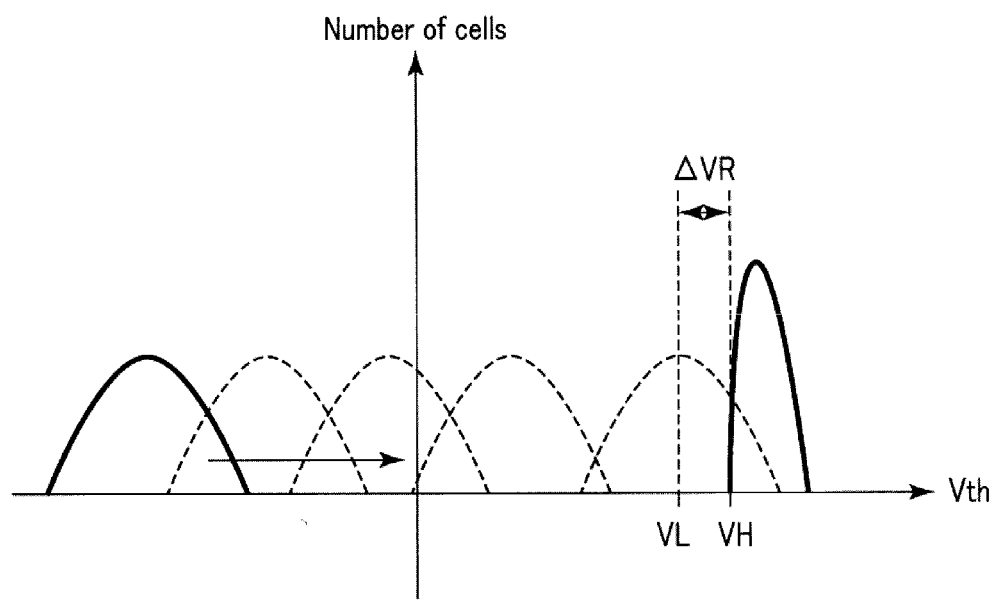
FIG. 15 is a graph illustrating multiple verify voltages used in a write operation performed by a semiconductor memory device according to a fifth embodiment using a QPW (quick pass write) method.

FIG. 15 illustrates a state in which the threshold voltage of the selected memory cell is shifted via the program operation. Two types of verify voltages VH and VL are used in the QPW method. The verify voltage VH is a final target for the threshold voltage of the selected memory cell, which is shifted by the write operation. In contrast, the verify voltage VL is set to be lower by $\Delta$VR than the verify voltage VH. It is possible to set $\Delta$VR to an arbitrary value.

A voltage applied to the bit line BL in the program operation is changed according to the threshold voltage of the selected memory cell, which is verified in the verify operation. When the threshold voltage of the selected memory cell is lower than the verify voltage VL, the ground voltage VSS is applied to the bit line BL. When the threshold voltage of the selected memory cell is the verify voltage VL or higher and is lower than the verify voltage VH, a voltage VQPW is applied to the bit line BL. VQPW is set to a value between VSS and VBL. When the threshold voltage of the selected memory cell is higher than or equal to the verify voltage VH, the voltage VBL is applied to the bit line BL.

The amount of shift of the threshold voltage of the selected memory cell caused by the program operation when VQPW is applied to the bit line BL is smaller than when VSS is applied to the bit line BL. When VBL is applied to the bit line BL, the shift of the threshold voltage of a selected memory cell is not caused by the program operation.

When the program operation is performed multiple times, the threshold voltage distribution of the selected memory cell is higher than or equal to the verify voltage VL. When the threshold voltage of the selected memory cell is higher than or equal to the verify voltage VH, the write operation in which data is written to the selected memory cell is ended.

As such, in the write operation using the QPW method, it is possible to reduce the width of the threshold voltage distribution of a selected memory cell having a threshold voltage close to the verify voltage VH by performing the program operation in which VQPW is applied to the bit line BL.

The QPW method is disclosed in detail in U.S. patent application Ser. No. 14/263,948 entitled "non-volatile semiconductor memory device" filed on Apr. 28, 2014. The QPW method is also disclosed in detail in U.S. patent application Ser. No. 12/563,296 entitled "non-volatile semiconductor memory device" filed on Sep. 21, 2009. The contents of these patent applications are incorporated in this specification by reference.

[5-2] Write Operation

Figure 16:
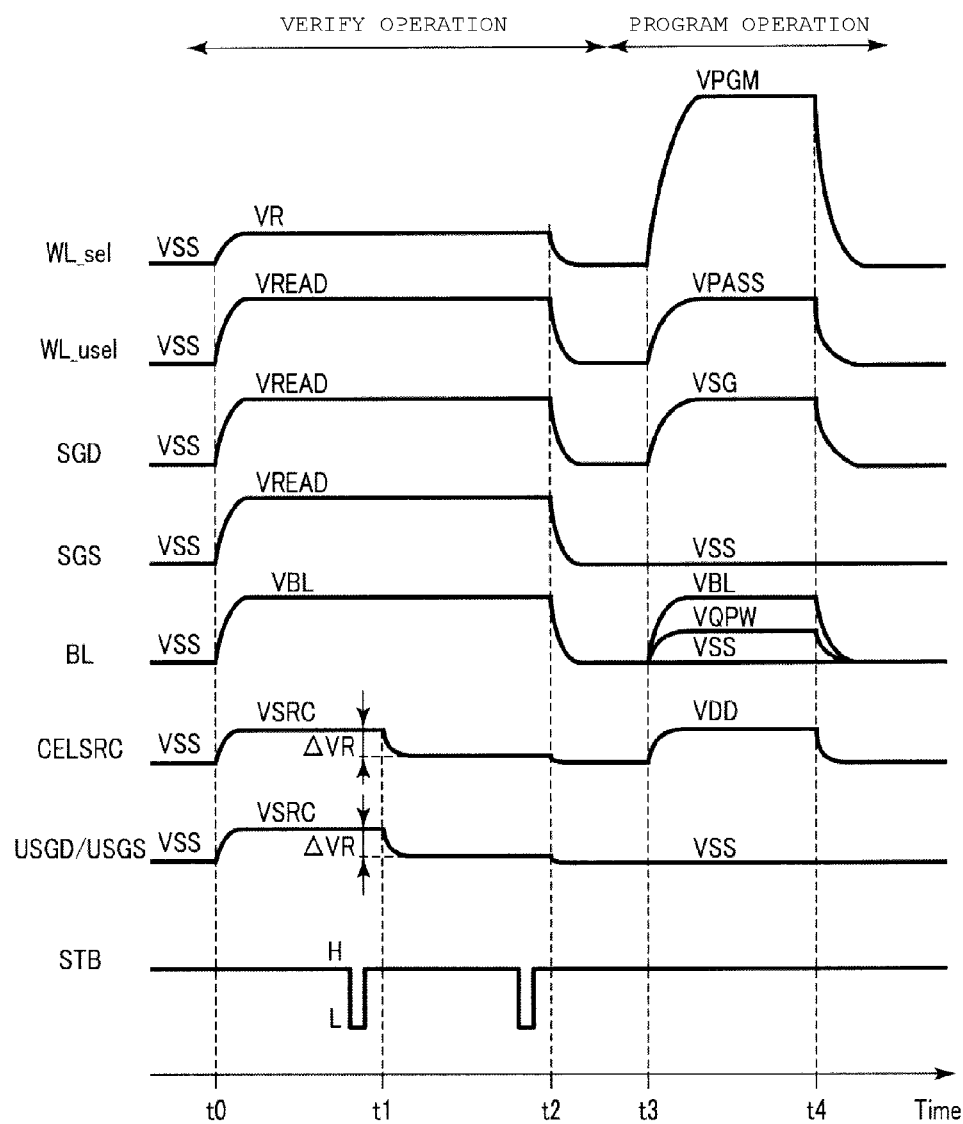
FIG. 16 is a timing chart illustrating the write operation performed by the semiconductor memory device according to the fifth embodiment using the QPW method.

A write operation using the QPW method in the semiconductor memory device 1 will be described in detail with reference to FIG. 16. FIG. 16 illustrates one verify operation and one program operation.

First, the verify operation will be described.

At time t0, the row decoder 11 sets the voltage of the selected word line WL_sel to a verify read voltage VR. VR is set to be higher than VH.

The row decoder 11 sets the voltages of the unselected word lines WL_usel and the select gate lines SGD and SGS to VREAD, and the voltages of the source line CELSRC and the unselected select gate lines USGD and USGS to VSRC. VR–VSRC corresponds to the verify voltage VL. Voltages applied to the unselected select gate line USGD and USGS are set to that of the source line CELSRC to improve an operation speed.

The sense amplifier module 12 sets the voltage of the bit line BL to VBL by applying a voltage to the bit line BL.

The sense amplifier module 12 senses a read result for a selected memory cell up to time t1. A sense timing is appropriately adjusted to a timing after the voltages of the selected word line WL_sel and the bit line BL go to VR–VSRC. VR–(VSRC+$\Delta$VL) corresponds to the verify voltage VH.

At time t1, the row decoder 11 steps down the voltages of the source line CELSRC and the unselected select gate lines USGD and USGS by $\Delta$VL.

The sense amplifier module 12 senses a read result for the selected memory cell up to time t2. A sense timing is appropriately adjusted to a timing after the voltages of the selected word line WL_sel and the bit line BL are stepped down $\Delta$VL.

At time t2, the row decoder 11 sets the voltages of the selected word line WL_sel, the unselected word lines WL_usel, the select gate lines SGD and SGS, the source line CELSRC, and the unselected select gate lines USGD and USGS to VSS.

The data latch DL of the sense amplifier module 12 latches a confirmed result of the threshold voltage of the selected memory cell via the verify operation.

Hereinafter, the program operation will be described.

At time t3, the sense amplifier module 12 applies a voltage to the bit line BL according to the confirmed result of the threshold voltage of the selected memory cell, which is latched by the data latch DL. The row decoder 11 sets the voltage of the selected word line WL_sel to VPGM. Accordingly, data is written to the selected memory cell according to the voltage of the bit line BL connected to the selected memory cell. The row decoder 11 sets the voltage of the unselected word line WL_usel to a program pass voltage VPASS. VPASS is lower than VPGM, and the memory cell transistor MT, the control gate electrode of which receives VPASS, is turned on. Accordingly, the writing of data to the memory cell transistor MT connected to the unselected word line WL_usel can be prohibited. The row decoder 11 sets the voltage of the source line CELSRC to VDD.

At time t4, the sense amplifier module 12 sets the voltage of the bit line BL to VSS. The row decoder 11 sets the selected word line WL_sel, the unselected word line WL_usel, the select gate lines SGD and SGS, and the source line CELSRC to VSS, and ends the program operation.

[5-3] Effects of Fifth Embodiment

In the write operation using the QPW method of the semiconductor memory device 1 according to the fifth embodiment, a verify operation for a selected memory cell is performed by stepping down the voltage of the source line CELSRC. Accordingly, similar to the first and second embodiments, it is possible to reduce an amount of time required for the verify operation, and to improve the write speed of the semiconductor memory device 1.

[6] Sixth Embodiment

The first to fifth embodiments are applied to the semiconductor memory device 1 according to a sixth embodiment, which has a structure in which memory cells are stacked on top of each other. Hereinafter, only the points of difference of the sixth embodiment with reference to the first to fifth embodiments will be described.

[6-1] Configuration of Memory Cell Array 10

Figure 17:
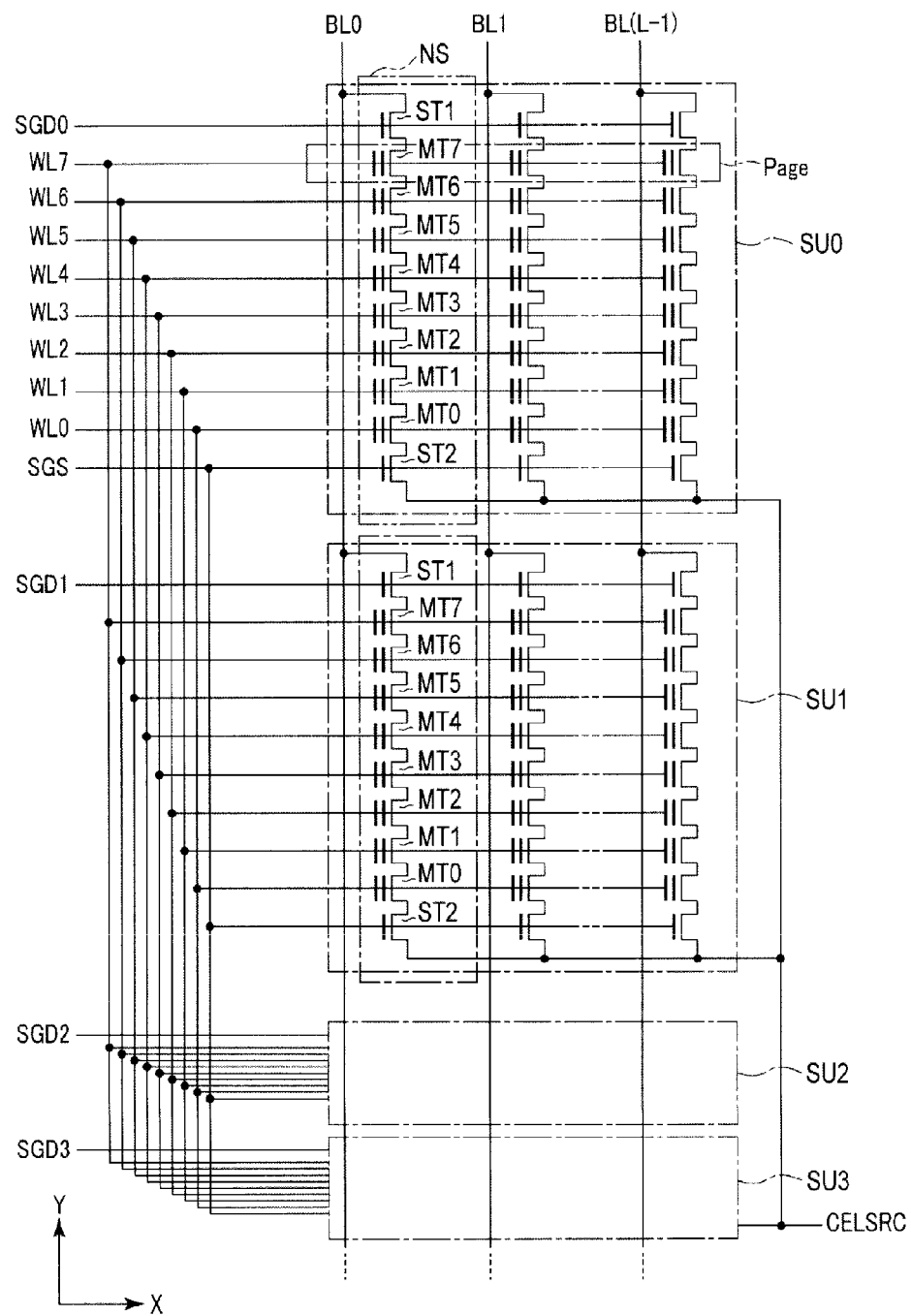
FIG. 17 is a circuit diagram of a memory cell array of a semiconductor memory device according to a sixth embodiment.

The circuit configuration of the memory cell array 10 will be described with reference to FIG. 17. FIG. 17 illustrates only one block BLK.

For example, the block BLK includes four string units SU. Each of the string units SU includes L (L is a natural number of one or greater) NAND strings NS. For example, the number of memory cell transistors MT included in the NAND string NS is eight.

The bit lines BL are provided along the Y direction, and L bit lines BL are arranged in parallel with each other. Each of the bit lines BL is connected in common to second ends of the select transistors ST1 of the NAND strings NS corresponding to the same column in multiple blocks BLK.

The word lines WL are provided in a plane which is extended in the X direction and the Y direction. For example, eight word lines WL are provided in each of the blocks BLK. The eight word lines WL are stacked on top of each other with an insulating film interposed therebetween. Each of the word lines WL is connected in common to control gates of the memory cell transistors MT corresponding to the same row in the blocks BLK. The L memory cell transistors MT connected to the same word line WL in the same string unit SU are treated as a page.

For example, four select gate lines SGD are provided in each of the blocks BLK. Each of the select gate lines SGD is connected in common to gates of the select transistors ST1 included in the NAND strings NS of the corresponding string unit SU in each of the blocks BLK.

For example, one select gate line SGS is provided in each of the blocks BLK. The select gate line SGS is connected in common to gates of the select transistors ST2 included in the NAND strings NS in each of the blocks BLK.

The source line CELSRC provided is common to multiple blocks BLK. The source line CELSRC is connected in common to second ends of the select transistors ST2 included in the NAND strings NS of each of the blocks BLK.

The block BLK is the data erasure unit in a three-dimensional semiconductor memory device; however, the data erasure unit is not limited to the block BLK. Other erase operations are disclosed in U.S. patent application Ser. No. 13/235,389 entitled "non-volatile semiconductor memory device" filed on Sep. 18, 2011, and in U.S. patent application Ser. No. 12/694,690 entitled "non-volatile semiconductor memory device" filed on Jan. 27, 2010. The entire contents of these patent applications are incorporated in this specification by reference.

Figure 18:
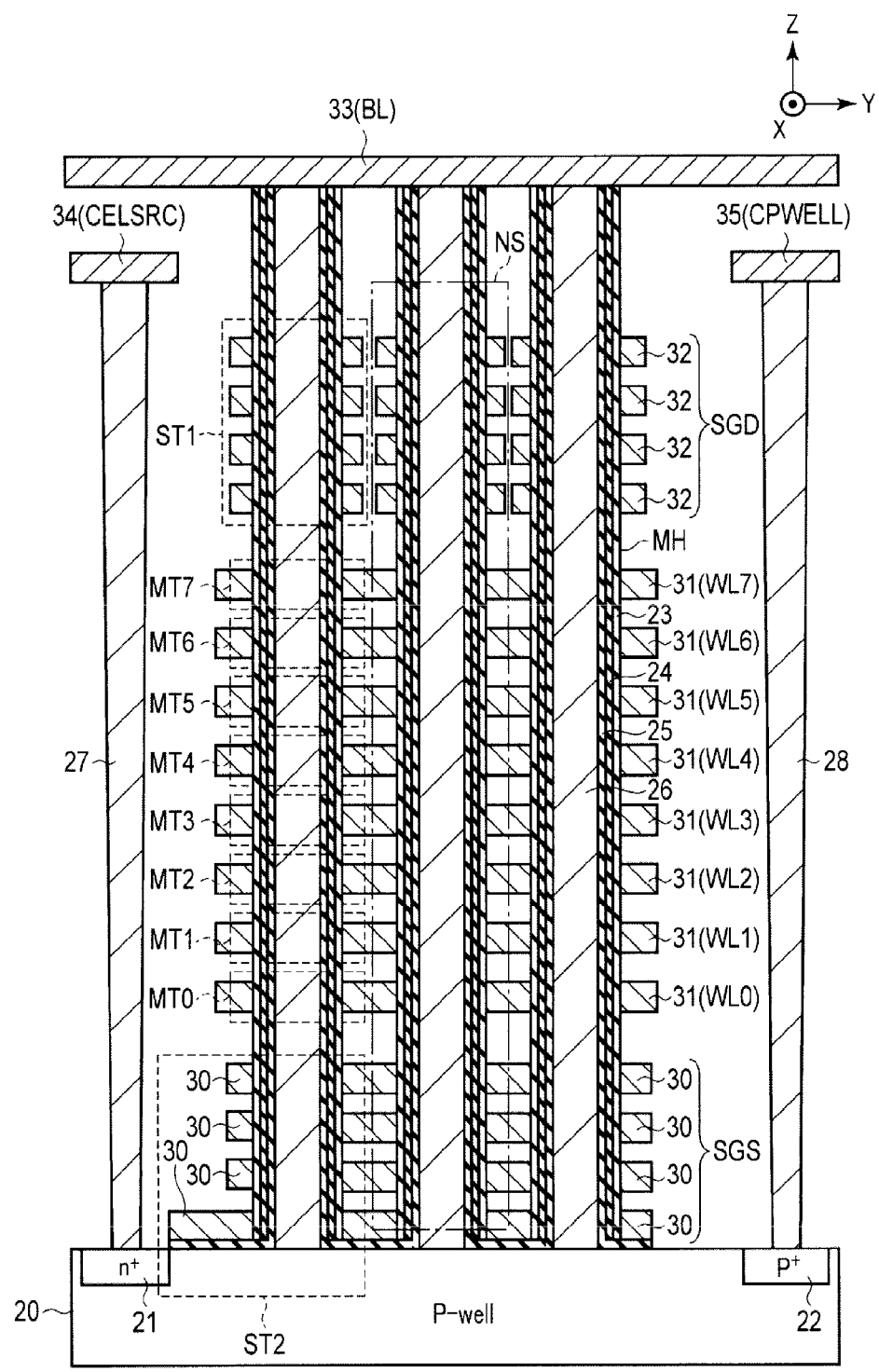
FIG. 18 is a sectional view of the memory cell array of the semiconductor memory device according to the sixth embodiment.

Hereinafter, the sectional structure of the memory cell array 10 will be described with reference to FIG. 18.

First, the configuration of a memory hole MH formed on a p-type well area 20 will be described.

Multiple memory holes MH are formed, and are provided on the p-type well area 20 along a Z direction. Each of the memory holes MH corresponds to one NAND string NS. For illustrative purposes, FIG. 18 illustrates an example of a section including three NAND strings NS. The three NAND strings NS illustrated in FIG. 18 correspond to the same block BLK and different string units SU.

A block insulating film 23, an insulating film 24, and a tunnel oxide film 25 are sequentially provided on a side surface of the memory hole MH. The insulating film 24 serves as a charge storage layer. In the memory hole MH, a semiconductor pillar 26 is provided further inward from the tunnel oxide film 25. The semiconductor pillar 26 is made of a conductive material, and for example, the conductive material is non-doped polysilicon. The semiconductor pillar 26 is a current path of the NAND string NS.

Hereinafter, the configuration of a wiring layer provided on the p-type well area 20 will be described. The semiconductor memory device 1 includes wiring layers 30 to 35 on the p-type well area 20.

Four wiring layers 30 are provided, and serve as the select gate line SGS and gate electrodes of the select transistor ST2. The lowermost wiring layer 30 and the tunnel oxide film. 25 are provided up to the vicinity of an $n^+$-type impurity diffusion area 21 formed inside the surface of the p-type well area 20. Accordingly, when the select transistor ST2 is turned on, a current path is formed between the NAND string NS and the $n^+$-type impurity diffusion area 21.

Eight wiring layers 31 are provided above the wiring layers 30. Each of the wiring layers 31 serves as the corresponding word line WL and control gate electrodes of the corresponding memory cell transistors MT.

Four wiring layers 32 are provided above the wiring layers 31. Each of the wiring layers 32 serves as the corresponding select gate line SGD and gate electrodes of the corresponding select transistors ST1.

One wiring layer 33 is provided above the wiring layers 32. The wiring layer 33 is connected to the semiconductor pillar 26 of the corresponding memory hole MH, and serves as the bit line BL.

One wiring layer 34 is provided and arranged between the wiring layers 32 and the wiring layers 33. The wiring layer 34 serves as the source line CELSRC. The wiring layer 34 is connected to the $n^+$-type impurity diffusion area 21 via a contact plug 27 made of a conductive material.

One wiring layer 35 is provided and arranged between the wiring layers 32 and the wiring layers 33. The wiring layer 35 serves as a well line CPWELL. The wiring layer 35 is connected to a $p^+$-type impurity diffusion area 22, which is formed inside the surface of the p-type well area 20, via a contact plug 28 made of a conductive material. The voltage generation circuit 18 is capable of changing the potential of the p-type impurity diffusion area 20 by applying a voltage to the well line CPWELL.

The wiring layers 30 to 32 and the contact plugs 27 and 28 are provided flat in the X direction.

In this configuration, one string unit SU is an aggregate of multiple NAND strings NS arrayed in the X direction, and multiple string units SU are arrayed in the X direction.

The memory cell array 10 may have other configurations, including the ones disclosed in U.S. patent application Ser. No. 12/407,403 entitled "three-dimensional stacked non-volatile semiconductor memory" filed on Mar. 19, 2009, U.S. patent application Ser. No. 12/406,524 entitled "three-dimensional stacked non-volatile semiconductor memory" filed on Mar. 18, 2009, U.S. patent application Ser. No. 12/679,991 entitled "three-dimensional stacked non-volatile semiconductor memory device and manufacturing method thereof" filed on Mar. 25, 2010, and U.S. patent application Ser. No. 12/532,030 entitled "semiconductor memory and manufacturing method thereof" filed on Mar. 23, 2009. The entire contents of these patent applications are incorporated in this specification by reference.

[6-2] Effects of Sixth Embodiment

The first to fifth embodiments are applied to the semiconductor memory device 1 according to the sixth embodiment, which has a structure in which memory cells are stacked on top of each other. In the semiconductor memory device 1 according to the sixth embodiment, the CR time constant of the source line CELSRC is less by approximately ¼ to approximately ¹⁄₁₀ than the CR time constant of the word line WL. The difference in CR time constant between the source line CELSRC and the word line WL are greater than a semiconductor memory device in which memory cells are provided in two dimensions. As a result, in the semiconductor memory device 1 according to the sixth embodiment, it is possible to improve the operation speed, and thus the effects are great compared to when the first to fifth embodiments are applied to the semiconductor memory device in which memory cells are provided in two dimensions.

[7] Others

Each of the semiconductor memory device in the aforementioned embodiments includes the memory cell transistor <<MT>> capable of storing first data <<the threshold voltage distribution E>> (refer to FIG. 4) corresponding to a threshold value and second data <<the threshold voltage distribution A>> (refer to FIG. 4) corresponding to a threshold value; the word line <<WL>> connected to the gate of the memory cell transistor; and the source line <<CELSRC>> electrically connected to the first end of the memory cell transistor. In a read operation of a memory cell, a first voltage <<VSRC>> (refer to FIG. 14) is applied to the source line when a first threshold value is determined, and a second voltage <<VSRC−Δsearch>> (refer to FIG. 14) different from the first voltage is applied thereto when a second threshold value is determined.

In addition, a third voltage <<ARsearch>> (refer to FIG. 14) is applied to the word line when the first threshold value and the second threshold value are determined.

Accordingly, it is possible to improve the operation speed of the semiconductor memory device.

Exemplary embodiments are not limited to the first to fifth embodiments, and can be modified in various forms. The ABL sensing method and the bit-line shielding sensing method are exemplarily described, and can be modified in various forms according to the circuit configuration of the sense amplifier module 12. In a read operation and a write operation, the points in time in which the sequencer 17 generates control signals may be offset from each other.

In the embodiments, (1) in the read operation, for example, a voltage applied to a word line selected in an A-level read operation is between 0 V and 0.55 V. The applied voltage is not limited to that range, and may be between 0.1 V and 0.24 V, between 0.21 V and 0.31 V, between 0.31 V and 0.4 V, between 0.4 V and 0.5 V, or between 0.5 V and 0.55 V.

For example, a voltage applied to a word line selected in a B-level read operation is between 1.5 V and 2.3 V. The applied voltage is not limited to that range, and may be between 1.65 V and 1.8 V, between 1.8 V and 1.95 V, between 1.95 V and 2.1 V, or between 2.1 V and 2.3 V.

For example, a voltage applied to a word line selected in a C-level read operation is between 3.0 V and 4.0 V. The applied voltage is not limited to that range, and may be between 3.0 V and 3.2 V, between 3.2 V and 3.4 V, between 3.4 V and 3.5 V, between 3.5 V and 3.6 V, or between 3.6 V and 4.0 V.

For example, an amount of time (tR) required for the read operation may be between 25 μs and 38 μs, between 38 μs and 70 μs, or between 70 μs and 80 μs.

(2) The write operation includes the aforementioned program operation and the aforementioned verify operation. In the write operation, for example, an initial voltage applied to a word line selected in the program operation is between 13.7 V and 14.3 V. The applied voltage is not limited to that range, and may be between 13.7 V and 14.0 V or between 14.0 V and 14.6 V.

An initial voltage applied to word lines selected when data is written to odd-numbered word lines may be different from an initial voltage applied to word lines selected when data is written to even-numbered word lines.

For example, when the program operation is performed using an incremental step pulse program (ISPP) method, a step-up voltage is approximately 0.5 V.

For example, a voltage applied to a unselected word line may be between 6.0 V and 7.3 V. The applied voltage is not limited to that range, and may be between 7.3 V and 8.4 V or may be less than or equal to 6.0 V.

An applied path voltage may be changed depending on whether an unselected word line is an odd-numbered word line or an even-numbered word line.

For example, an amount of time (tProg) required for the write operation may be between 1700 μs and 1800 μs, between 1800 μs and 1900 μs, or between 1900 μs and 2000 μs.

(3) For example, in the erase operation, an initial voltage applied to the well, which is formed on the semiconductor substrate, and on which the memory cells are arranged, is between 12 V and 13.6 V. The applied voltage is not limited to that range, and may be between 13.6 V and 14.8 V, between 14.8 V and 19.0 V, between 19.0 V and 19.8 V, or between 19.8 V and 21 V.

For example, an amount of time (tErase) required for the erase operation may be between 3000 μs and 4000 μs, between 4000 μs and 5000 μs, or between 4000 μs and 9000 μs.

(4) The memory cell is structured to include charge storage layers that are arranged on the semiconductor substrate (silicon substrate) with the tunnel insulating film (having a film thickness of 4 nm to 10 nm) interposed therebetween. The charge storage layer may have a structure in which an SiN insulating film or an SiON insulating film with a film thickness of 2 nm to 3 nm is staked on a polysilicon film with a film thickness of 3 nm to 8 nm. Metal such as Ru may be added to polysilicon. An insulating film is provided on the charge storage layer. This insulating film includes a silicon oxide film with a film thickness of 4 nm to 10 nm that is interposed between a lower-layer High-k film with a film thickness of 3 nm to 10 nm and an upper-layer High-k film with a film thickness of 3 nm to 10 nm. The High-k film is made of HfO or the like. The film thickness of the silicon oxide film can be set to be greater than that of the High-k film. A control electrode with a film thickness of 30 nm to 70 nm is formed on the insulating film with a material with a film thickness of 3 nm to 10 nm between the insulating film and the control electrode. The material referred to here is a metal oxide film made of TaO or the like, or a metal nitride film made of TaN or the like. The control electrode can be made of W or the like.

Air gaps can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell;
   a word line electrically connected to a gate of the memory cell; and
   a source line electrically connected to a first end of the memory cell,
   wherein in a read operation of the memory cell, a first voltage is applied to the source line in a first operation to determine whether or not a threshold voltage of the memory cell is above a first threshold value, a second voltage is applied to the source line in a second operation to determine whether or not the threshold voltage of the memory cell is above a second threshold value, and a third voltage is applied to the source line in a third operation to determine whether or not the threshold voltage of the memory cell is above a third threshold value.

2. The semiconductor memory device according to claim 1,
   wherein a fourth voltage is applied to the word line during the first, second, and third operations.

3. The semiconductor memory device according to claim 2, wherein a value of data stored in the memory cell is determined after the first, second, and third operations.

4. The semiconductor memory device according to claim 1, further comprising:
   a bit line electrically connected to a second end of the memory cell,
   wherein the read operation is performed during a write operation as a verify operation that precedes a program operation.

5. The semiconductor memory device according to claim 1, further comprising:
   other memory cells each having a gate electrically connected to the word line and a first end electrically connected to the source line; and
   a plurality of bit lines, each of the bit lines connected to a second end of one of the memory cells,
   wherein the read operation is performed on all of the memory cells.

6. The semiconductor memory device according to claim 1, further comprising:
   other memory cells each having a gate electrically connected to the word line and a first end electrically connected to the source line; and
   a plurality of bit lines, each of the bit lines connected to a second end of one of the memory cells,
   wherein the read operation is performed on the memory cells that are electrically connected to every other one of the bit lines.

7. The semiconductor memory device according to claim 1,
   wherein the second voltage is lower than the first voltage when the second threshold value is greater than the first threshold value, and the second voltage is higher than the first voltage when the second threshold value is less than the first threshold value.

8. The semiconductor memory device according to claim 1, further comprising:
   a bit line;
   a first string of memory cells, including the memory cell, that are electrically connected in series between the bit line and the source line;
   a first select transistor electrically connected between the bit line and the first string of memory cells;
   a second select transistor electrically connected between the bit line and the second string of memory cells;
   a first select line electrically connected to a gate of the first select transistor; and
   a second select line electrically connected to a gate of the second select transistor,
   wherein in the read operation, substantially the same voltage as that applied to the source line is applied to the second select line.

9. A semiconductor memory device comprising:
   a memory cell;
   a word line electrically connected to a gate of the memory cell;
   a source line electrically connected to a first end of the memory cell; and
   a control circuit configured to execute a first read operation in response to a first command and a second read operation in response to a second command, wherein
   in the first read operation, a first voltage is applied to the source line while a second voltage is applied to the word line to determine whether or not a threshold voltage of the memory cell is above a first threshold value and the first voltage is applied to the source line while a third voltage is applied to the word line to determine whether or not the threshold voltage of the memory cell is above a second threshold value, and
   in the second read operation, a fourth voltage is applied to the word line while a fifth voltage is applied to the source line to determine whether or not the threshold voltage of the memory cell is above the first threshold value and the fourth voltage is applied to the word line while a sixth voltage is applied to the source line to determine whether or not the threshold voltage of the memory cell is above the second threshold value.

10. The semiconductor memory device according to claim 9, wherein a difference between the second and third voltages is equal to a difference between the fifth and sixth voltages.

11. The semiconductor memory device according to claim 9, wherein a processing time required for the read operation executed in response to the first command is longer than a processing time required for the read operation executed in response to the second command.

12. A semiconductor memory device comprising:
    a plurality of memory cells;
    a word line electrically connected to a gate of each memory cell; and
    a source line electrically connected to a first end of each memory cell,
    wherein in a read operation of the memory cell, a first voltage is applied to the source line in a first operation to determine as a first number, the number of memory cells that have threshold voltages above a first threshold value, a second voltage is applied to the source line in a second operation to determine as a second number, the number of memory cells that have threshold voltages above a second threshold value, and a third voltage is applied to the source line in a third operation to determine as a third number, the number of memory cells that have threshold voltages above a third threshold value.

13. The semiconductor memory device according to claim 12, wherein a fourth voltage is applied to the word line during both the first, second, and third operations.

14. The semiconductor memory device according to claim 13, wherein the read operation includes a fourth operation in which one of the first, second, and third voltages is applied to the source line to read the value of data stored in the memory cell.

15. The semiconductor memory device according to claim 14, wherein the first voltage is applied to the source line during the fourth operation when the first number is greater than the second number and the third number.

16. The semiconductor memory device according to claim 12,
wherein the second voltage is lower than the first voltage when the second threshold value is greater than the first threshold value, and the second voltage is higher than the first voltage when the second threshold value is less than the first threshold value.

17. The semiconductor memory device according to claim 12, further comprising:
a plurality of bit lines, each of the bit lines connected to a second end of one of the memory cells,
wherein the read operation is performed on all of the memory cells.

18. The semiconductor memory device according to claim 12, further comprising:
a plurality of bit lines, each of the bit lines connected to a second end of one of the memory cells,
wherein the read operation is performed on the memory cells that are electrically connected to every other one of the bit lines.

* * * * *